United States Patent
Botez

(10) Patent No.: US 7,457,340 B2
(45) Date of Patent: Nov. 25, 2008

(54) HIGH COHERENT POWER, TWO-DIMENSIONAL SURFACE-EMITTING SEMICONDUCTOR DIODE ARRAY LASER

(75) Inventor: Dan Botez, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 354 days.

(21) Appl. No.: 11/112,749

(22) Filed: Apr. 22, 2005

(65) Prior Publication Data

US 2005/0238079 A1    Oct. 27, 2005

Related U.S. Application Data

(63) Continuation-in-part of application No. 10/345,613, filed on Jan. 16, 2003, now Pat. No. 6,885,686.

(60) Provisional application No. 60/350,826, filed on Jan. 18, 2002.

(51) Int. Cl.
*H01S 5/00* (2006.01)
(52) U.S. Cl. .................. 372/50.11; 372/50.12
(58) Field of Classification Search ............. 372/50.12, 372/50.11
See application file for complete search history.

(56) References Cited

U.S. PATENT DOCUMENTS

| | | | |
|---|---|---|---|
| 4,023,993 A | 5/1977 | Scifres et al. | |
| 4,796,274 A | 1/1989 | Akiba et al. | |
| 4,847,844 A | 7/1989 | Noda et al. | |
| 4,894,835 A | 1/1990 | Uomi et al. | |
| 4,919,507 A * | 4/1990 | Evans et al. | 385/37 |
| 4,958,357 A | 9/1990 | Kinoshita | |
| 4,975,923 A | 12/1990 | Buus et al. | |
| 4,985,897 A * | 1/1991 | Botez et al. | 372/50.12 |
| 5,052,016 A | 9/1991 | Mahbobzadeh et al. | |
| 5,086,430 A | 2/1992 | Kapon et al. | |
| 5,170,405 A | 12/1992 | Connolly et al. | |
| 5,208,824 A | 5/1993 | Tsang | |
| 5,238,531 A | 8/1993 | Macomber et al. | |
| 5,241,556 A | 8/1993 | Macomber et al. | |
| 5,255,278 A | 10/1993 | Yamanaka | |
| 5,263,041 A | 11/1993 | Pankove | |

(Continued)

FOREIGN PATENT DOCUMENTS

WO    WO 01/13480    2/2001

OTHER PUBLICATIONS

Botez, "High-Power Coherent, GaAs-Based Monolithic Semiconductor Lasers," Proceedings of the SPIE—The International Society for Optical Engineering SPIE-Int. Soc. Opt. Eng. USA, vol. 4533, Nov. 2001, pp. 41-46.

(Continued)

*Primary Examiner*—Minsun Harvey
*Assistant Examiner*—Patrick Stafford
(74) *Attorney, Agent, or Firm*—Foley & Lardner LLP

(57) ABSTRACT

A semiconductor laser is formed on a semiconductor substrate with an array of laterally spaced laser device elements each including a second order distributed feedback grating bounded by distributed Bragg reflector gratings. The device elements in which the distributed feedback grating and the distributed Bragg reflector gratings are formed have a lower effective index than the index of the interelement regions and are spaced so as to form an antiguided array.

35 Claims, 13 Drawing Sheets

U.S. PATENT DOCUMENTS

| | | | |
|---|---|---|---|
| 5,272,714 | A | 12/1993 | Chen et al. |
| 5,276,700 | A | 1/1994 | Jansen et al. |
| 5,295,150 | A | 3/1994 | Vangieson et al. |
| 5,323,405 | A | 6/1994 | Kamiyama et al. |
| 5,329,542 | A | 7/1994 | Westbrook |
| 5,345,466 | A | 9/1994 | Macomber |
| 5,347,533 | A | 9/1994 | Higashi et al. |
| 5,432,812 | A | 7/1995 | Kurobe et al. |
| 5,452,318 | A | 9/1995 | Makino et al. |
| 5,500,868 | A * | 3/1996 | Kurihara ............... 372/46.015 |
| 5,536,085 | A | 7/1996 | Li et al. |
| 5,606,570 | A | 2/1997 | Botez et al. |
| 5,617,436 | A | 4/1997 | Lo |
| 5,727,013 | A | 3/1998 | Botez et al. |
| 5,867,521 | A | 2/1999 | Macomber |
| 6,167,073 | A * | 12/2000 | Botez et al. .............. 372/46.01 |
| 6,195,381 | B1 | 2/2001 | Botez et al. |
| 6,330,265 | B1 | 12/2001 | Kinoshita |
| 6,643,316 | B2 | 11/2003 | Macomber |
| 6,791,104 | B2 | 9/2004 | Tansu et al. |
| 6,810,053 | B1 | 10/2004 | Botez et al. |
| 2002/0001111 | A1* | 1/2002 | Evans et al. .................... 359/34 |
| 2002/0079485 | A1 | 6/2002 | Stintz et al. |
| 2002/0196826 | A1 | 12/2002 | Mears et al. |
| 2005/0031002 | A1 | 2/2005 | Botez |

OTHER PUBLICATIONS

Botez, "Active Photonic Lattices for High-Coherent-Power Generation," Proceedings of the SPIE-The International Society for Optical Engineering SPIE-Int. Soc. Opt. Eng. USA, vol. 4651, May 2002, pp. 233-237.

Botez, "Active Photonic Lattices: Lasers for Watt-Range Coherent-Power Generation," Proceedigns of the SPIE-The International Society for Optical Engineering SPIE-Int. Soc. Opt. Eng. USA, vol. 4905, Aug. 2002, pp. 78-84.

Supplementary European Search Report for EP03705806 dated Oct. 12, 2005.

Steven H. Macomber, "Design of High-Power, Surface-Emitting DFB Lasers for Suppression of Filamentation", Proc. SPIE, vol. 4993, 2003, pp. 37-49.

Shuang Li and Dan Botez, "Design for High-Power Single-Mode Operation From 2-D Surface-Emitting ROW-DFB Lasers", IEEE Photonics Technology Letters, vol. 17, No. 3, Mar. 2005, pp. 519-521.

Dan Botez, Luis Figueroa, "Laser-Diode Technology and Applications II", Proc. SPIE, Vo. 1219, 1990, pp. 228-232.

M. Matsumoto, M. Taneya, S. Matsui, S. Yano, and T. Hijikata, "Single-Lobed Far-Field Pattern Operation in a Phased Array with an Integrated Phase Shifter", Appl. Phys. Lett., vol. 50, No. 22, 1987, pp. 1541-1543.

D.E. Ackley, D. Botez and B. Bogner, "Phase-Locked Injection Laser Arrays with Integrated Phase Shifters", RCA Review, vol. 44, Dec. 1983, pp. 625-633.

S. H. Macomber, "Nonlinear Analysis of Surface-Emitting Distributed Feedback Lasers", IEEE Journal of Quantum Electronics, vol. 26, No. 12, Dec. 1990, pp. 2065-2073.

Jun-Ichi Kinoshita, "Axial Profile of Grating Coupled Radiation from Second-Order DFB Lasers with Phase Shifts," IEEE Journal of Quantum Electronics, vol. 26, No. 3, Mar. 1990, pp. 407-412.

S. F. Yu, et al., "Effect of External Reflectors on Radiation Profile of Grating Coupled Surface Emitting Lasers," IEE Proceedings J. Optoelectronics, GB, Institution of Electrical Engineers, Stevenage, vol. 140, No. 1, Feb. 1, 1993, pp. 30-38.

Luke J. Mawst, et al., "Two-Dimensional Surface-Emitting Leaky-Wave Coupled Laser Arrays," IEEE Journal of Quantum Electronics, vol. 29, No. 6, Jun. 1993, pp. 1906-1917.

James Lopez, et al., "Uniform near-field, symmetric-mode surface emission from complex-coupled 2nd-order distributed-feedback lasers," Conference Proceedings, Leos '97, 10th Annual Meeting, IEEE Lasers and Electro-Optics Society 1997 Annual Meeting, vol. 1, pp. 9-10.

B. Xu, et al., "Grating Coupling for Intersubband Emission," Applied Physics Letters, US, American Institute of Physics, New York, vol. 70, No. 19, May 12, 1997, pp. 2511-2513.

James Lopez, et al., "Single-mode, single-lobe operation of surface-emitting, second-order distributed feedback lasers," Applied Physics Letters, AIP, USA, vol. 75, No. 7, Aug. 16, 1999, pp. 885-887.

Nils W. Carlson, et al., "Mode Discrimination in Distributed Feedback Grating Surface Emitting Lasers Containing a Buried Second-Order Grating," IEEE Journal of Quantum Electronics, vol. 27, No. 6, Jun. 1991, pp. 1746-1752.

Steven H. Macomber, et al., "Curved-Grating, Surface-Emitting DFB Lasers and Arrays," Proc. SPIE, vol. 3001, No. 42, 1997, pp. 42-54.

James Lopez, et al., "Surface-emitting, distributed-feedback diode lasers with uniform near-field intensity profile," Applied Physics Letters, vol. 73, No. 16, Oct. 19, 1998, pp. 2266-2268.

H. Kogelnik, et al., "Coupled-Wave Theory of Distributed Feedback Lasers," J. Appl. Phys., vol. 43, No. 5, May 1972, pp. 2327-2335.

Charles H. Henry, et al., "Observation of Destructive Interference in the Radiation Loss of Second-Order Distributed Feedback Lasers," IEEE J. of Quantum Electronics, vol. QE-21, No. 2, Feb. 1985, pp. 151-153.

Roel G. Baets, et al., "On the Distinctive Features of Gain Coupled DFB Lasers and DFB Lasers with Second Order Grating," IEEE J. of Quantum Electronics, vol. 29, No. 6, Jun. 1993, pp. 1792-1798.

Klaus David, et al., "Basic Analysis of AR-Coated, Partly Gain-Coupled DFB Lasers: The Standing Wave Effect," IEEE J. of Quantum Electronics, vol. QE-28, No. 2, Feb. 1992, pp. 427-433.

Masoud Kasraian, et al., "Metal-grating-outcoupled, surface emitting distributed-feedback diode lasers," Appl. Phys. Lett., vol. 69, No. 19, Nov. 4, 1996, pp. 2795-2797.

G. Witjaksono, et al., Single-Lobe, Orthonormal-Beam Surface Emission from 2nd-Order DFB/DBR Lasers with Half-Wave Grating Phaseshift, Paper No. ThC4, Conference Digest, 2002 IEEE 18th International Semiconductor Laser Conference, Garmisch, Germany, Sep. 29-Oct. 3, 2002, pp. 165-166.

Diode Laser Arrays (Book), Dan Botez and Dan R. Scifres, Eds., Cambridge University Press, 1994, pp. 50-53.

Botez, D., "High-power coherent GaAs-based monolithic semiconductor lasers," Semiconductor Lasers for Lightwave Communication Systems; Carmen S. Menoni, Richard P. Mirin, Eds.; *Proceedings of SPIE*, vol. 4533 (2001).

* cited by examiner

InGaP 400nm, Grating: 100nm 50nm InGaAs, 220nm GaAs, InGaAs 8000cm-1, n=3.7
DBR/DFB/DBR: 700/8000/700

InGaP 400nm, Grating: 100nm 50nm InGaAs, 220nm GaAs, InGaAs 8000cm-1, n=3.7
Upper 110nm GaAs with 600cm-1, lower 110nm GaAs with 10cm-1
DBR/DFB/DBR: 700/8000/700

HIGH COHERENT POWER, TWO-DIMENSIONAL SURFACE-EMITTING SEMICONDUCTOR DIODE ARRAY LASER

CROSS-REFERENCE TO RELATED APPLICATIONS

This application is a continuation-in-part of and claims priority to U.S. patent application Ser. No.10/345,613, filed on Jan. 16, 2003, pending, which claims the benefit of provisional application No. 60/350,826, filed Jan. 18, 2002, the disclosures of which are incorporated by reference.

REFERENCE TO GOVERNMENT RIGHTS

This invention was made with United States government support awarded by the following agency: NSF 0200321. The United States government has certain fights in this invention.

FIELD OF THE INVENTION

This invention pertains generally to the field of semiconductor diode lasers and diode laser arrays.

BACKGROUND OF THE INVENTION

Phase locked arrays of antiguide laser structures were demonstrated over a decade ago. See, D. Botez, et al. "High-Power Diffraction Limited Beam Operation from Phase Locked Diode Laser Arrays of Closely Spaced 'Leaky' Wave Guides (Antiguides)," Appl. Phys. Lett., Vol. 53, 1988, pp. 464 et seq. In an antiguide laser, the antiguide core has an index $n_o$ lower than the cladding index, $n_1$. Whereas in a positive index guide, light is trapped in the guide core via total internal reflection, in an antiguide light is only partially reflected at the antiguide-core boundaries. Light refracted into the cladding layers is radiation leaking outwardly with lateral (projected) wavelength $\lambda_1$, and can be thought of as a radiation loss, $\alpha_r$. See, D. Botez, "Monolithic Phase-Locked Semiconductor Laser Arrays," Chapter 1 in *Diode Laser Arrays*, D. Botez and D. R. Scifres, Eds. Cambridge, U.K., Cambridge Univ. Press, 1994, pp. 1-72. For a proper mode to exist, $\alpha_r$ has to be compensated for by gain in the antiguide core. The effective indices of the supported leaky modes have values below the core index, the quantum-mechanical equivalent being quasi-bound states above a potential barrier. Although in a single antiguide the radiation losses can be quite high, closely spacing antiguides in linear arrays significantly reduces the device losses, since radiation leakage from individual elements mainly serves the purpose of coupling the array elements.

Due to lateral radiation, a single antiguide, for which the index of refraction varies in only one dimension, can be thought of as a generator of laterally propagating traveling waves of wavelength $\lambda_1$. In an array of antiguides, elements will resonantly couple in-phase or out-of-phase when the interelement spacings correspond to an odd or even number of (lateral) half-wavelengths $\lambda_1/2$, respectively. When the resonance condition is met, the interelement spacings become Fabry-Perot resonators in the resonance condition, and thus full transmission occurs through the array structure allowing each element to equally couple to all others (i.e., global coupling is achieved). Resonant leaky-wave coupling allows the realization of global coupling for any type of phase locked laser array. See, D. Botez et al. "Resonant Leaky-Wave Coupling in Linear Arrays of Antiguides," Electron. Lett., Vol. 24, August 1988, pp. 1328-1330; D. Botez, et al. "Resonant Optical Transmission and Coupling in Phase-Locked Diode Laser Arrays of Antiguides: The Resonant Optical Waveguide Array," Appl. Phys. Lett., Vol. 54, May 1989, pp. 2183-2185. At its resonance, the in-phase mode intensity profile becomes uniform. The unwanted out-of-phase mode(s) are non-resonant, which causes their fields to be significantly trapped between elements, and these modes can thus be effectively suppressed using interelement loss. Another way of suppressing out-of-phase modes is by the use of intracavity Talbot-type spatial filters. See, D. Botez, et al., "Phase-Locked Arrays of Antiguides: Modal Content and Discrimination," IEEE J. Quantum Electron., Vol. 26, March 1990, pp. 482-485. However, the above description for resonant leaky-wave coupling holds only for structures in which the index of refraction varies periodically in only one dimension, the lateral one. For real antiguided devices, the index of refraction varies periodically in two dimensions, such that resonant coupling of the elements does not necessarily occur when the interelement spacings correspond to an odd or even number of (lateral) half-wavelengths $\lambda_1/2$, respectively, but rather when the interelement spacings correspond to an odd or even number of (lateral) half-wavelengths $\lambda_1/2$ plus a length which is a function of the two-dimensional details of the structure. See, D. Botez, "Monolithic phase-locked semiconductor laser arrays," pp. 1-71 in "Diode Laser Arrays," D. Botez and D. R. Scifres eds., Cambridge Univ. Press, UK, 1994.

Edge emitting devices, called ROW arrays, have exceeded the one watt coherent-power barrier (D. Botez, et al., "Watt-Range, Coherent Uniphase Power from Phase-Locked Arrays of Antiguide Diode Lasers," Appl. Phys. Lett., Vol. 58, May 1991, pp. 2070-2072), demonstrated 10 W of peak pulse power in a beam twice the diffraction limit (H. Yang, et al., "10 W Near-Diffraction-Limited Pulsed Power From 0.98 µm-Emitting, Al-Free Phase Locked Antiguided Arrays," Electron. Lett., Vol. 33, 1997, pp. 136-138), and 1.6 W continuous wave (CW) power in a twice diffraction limited beam (H. Yang, et al., "1.6 W Continuous-Wave Coherent Power From Large-Index-Step [$\Delta n \approx 0.1$] Near-Resonant Antiguided Diode Laser Arrays" Appl. Phys. Lett., Vol. 76, 2000, pp. 1219-1221). These milestones in stable, coherent power were due both to global coupling as well as to high built-in index steps ($\Delta n = 0.05$-$0.10$) structures, which makes the desired in-phase mode relatively insensitive to gain spatial hole burning (GSHB) and thermal lensing. Comprehensive above-threshold analyses have confirmed the basic immunity of ROW arrays to GSHB. Furthermore, unlike evanescent-wave-coupled arrays, ROW arrays do not display coupling-induced instabilities, as expected for globally-coupled arrays. ROW arrays, due to large index steps as well as reliance on periodic gain modulation for selecting lasing of specific traveling-wave modes, were effectively the first active photonic lattices (APLs) employed for the generation of high coherent power. Bloch-function analysis showed them to be equivalent to $2^{nd}$ order complex-coupled lateral distributed feedback (DFB) structures of zero stopgap, and further Bloch-function analyses of finite structures have allowed the derivation of analytical formulae for all relevant design parameters.

Antiguided-array structures have also been used for creating other APL-type devices. These include flat phasefront, stable beam fanout MOPA devices (See, Zmudzinski, et al., "3-Core ARROW-Type Diode Laser: Novel High-Power Single-Mode Device, and Effective Master Oscillator for Flared Antiguided MOPAs," IEEE J. Select. Topics Quantum Electron., Vol. 1, No. 2, June 1995, pp. 129-137; D. Botez, et al., "Flat Phasefront Fanout-Type Power Amplifier Employing Resonant-Optical Waveguide Structures," Appl. Phys.

Lett., Vol. 63, December 1993, pp. 3113-3115), ARROW devices (L. J. Mawst, et al., "Design Optimization of ARROW-Type Diode Lasers," IEEE Photonics Tech. Lett., Vol. 4, November 1992, pp. 1204-1206; L. J. Mawst, et al., "High-Powered, Single Mode, Al Free InGaAs, [P]/InGaP/ GaAs Distributed Feedback Diode Lasers," Journal of Crystal Growth, Vol. 195, 1998, pp. 609 et seq.; D. Zhou, et al., "Simplified Antiresonant Reflecting Optical Wave Guide-Type Vertical-Cavity Surface-Emitting Lasers," Appl. Phys. Lett., Vol. 76, 2000, pp. 1659 et seq.); and Triple-Core ARROW Devices (A. Bhattacharya, et al., "0.4 W CW Diffraction-Limited-Beam Al-Free, 0.98 µm Three Core ARROW-Type Diode Lasers," Electron. Lett., Vol. 32, 1996, pp. 657-658) which have demonstrated high CW ($\geq$0.4 W) coherent powers, as well as well as one-dimensional and two-dimensional ROW arrays of vertical cavity surface emitting lasers (VCSELs) (S. K. Serkland, et al., "Two-Element Phased Array of Antiguided Vertical-Cavity Lasers," Appl. Phys. Lett., Vol. 75, 1999, pp. 3754 et seq.; D. Zhou, et al., "Two-Dimensional Phase-Locked Antiguided Vertical Cavity Surface-Emitting Laser Arrays," Appl. Phys. Lett., Vol. 77, 2000, pp. 2307 et seq.). However, ROW arrays can be prone to self-pulsations either if saturable absorption occurs in lossy interelement regions or when imaging, in intracavity Talbot-type spatial filters, is disturbed by GSHB. Single-frequency pulsed operation can be achieved for edge-emitting devices by using DFB gratings, but the yield of in-phase-mode operating devices has been quite low, since the effective yield is a strong function of the grating phase(s) with respect to the cleaved mirror facet(s). M. P. Nesnidal, et al., "Distributed Feedback Grating Used as an Array-Mode Selector in Resonant Antiguided Diode Laser Arrays: Effects of the Mirror Facet Position With Respect to the Grating," IEEE Photon. Tech. Lett., Vol. 10, 1998, pp. 507 et seq.; and N. Nesnidal, et al., "0.45 W Diffraction-Limited-Beam and Single-Frequency Operation from Resonant Antiguided Phase-Locked Laser Array With Distributed Feedback Gratings," Appl. Phys. Lett., Vol. 73, 1998, pp. 587 et seq.

Second-order DFB laser structures for use as surface emitters, based on outcoupling perpendicular to the chip surface, have been studied for nearly three decades. However, it has been found both theoretically as well as experimentally that the favored mode to lase is an antisymmetric one (that is, a two-lobed pattern), since it has the least radiation loss. Furthermore, the guided-field pattern is highly nonuniform, making the device vulnerable to multimoding via longitudinal GSHB. C. H. Henry, et al., "Observation of Destructive Interference in the Radiation Loss of Second-Order Distributed Feedback Lasers," IEEE J. QE, Vol. 21, 1985, pp. 151-153.

Several approaches have been tried to obtain symmetric-like mode operation or actual symmetric mode operation. The first approach involves using a $\pi$ phase-shifting film deposited on half the device aperture (S. H. Macomber, et al., "Recent Developments in Surface Emitting Distributed Feedback Arrays," Proc. SPIE, Vol. 1219, 1990, pp. 228 et seq.). The second approach involves a long (about 2 mm) chirped grating (S. H. Macomber, "Nonlinear Analysis of Surface-Emitting Distributed Feedback Lasers," IEEE J. QE, Vol. 26, 1990, pp. 2065-2074), which phase shifts the antisymmetric mode such that the devices operate in an off-normal single lobe pattern. A third approach causes pure symmetric-mode operation either by preferential carrier injection in a weak-coupling grating region (N. W. Carlson, "Mode Discrimination in Distributed Feedback Grating Surface Emitting Lasers Containing a Buried Second Order Grating," IEEE J. QE, Vol. 27, 1991, pp. 1746-1752), or by introducing a metal grating which suppresses antisymmetric-mode lasing (M. Kasraian, et al., "Metal Grating Outcoupled, Surface-Emitting Distributed Feedback Diode Lasers," Appl. Phys. Lett., Vol. 69, 1996, pp. 2795-2797). However, preferential carrier injection is not a long-term reliable approach, and the scheme, due to the necessity for weak coupling grating, inherently leads to inefficient devices (about 10% efficiency). The metal-grating variant of the approach is feasible but introduces too much of a penalty loss for the symmetric mode, such that efficiencies are at best 25-30%, and the gain thresholds are quite high (about 70 cm$^{-1}$).

More recently, a solution to obtaining a symmetric-mode beam pattern with no penalty in device efficiency has been found in the use of central grating phase shifts of around $\pi$ in distributed feedback/distributed Bragg reflector (DFB/DBR) devices. G. Witjaksono, et al., "Surface-Emitting Single Lobe Operation from $2^{nd}$-Order Distributed-Reflector Lasers With Central Grating Phase Shift," Appl. Phys. Lett., Vol. 78, 2001, pp. 4088-4090; Dan Botez, et al., "Single Mode, Single Lobe Surface Emitting Distributed Feedback Semiconductor Laser," Published International Application No. WO 01/13480 A1, 22 Feb. 2001. An example is a structure having a double-quantum-well (DQW) InGaAs/InGaAsP active region with InGaP cladding layers, and a grating formed in a P$^+$-GaAs cap layer. The DQW active region is designed to be 0.4-0.5 µm away from the metal contact such that the device efficiency and reliability are unaffected. A symmetric-like mode is favored to lase over the antisymmetric-like mode when the grating phase shift, $\Delta\phi$, ranges from 100° to 280°, with maximum discrimination occurring when $\Delta\phi$=180°, i.e., a half wave ($\lambda/2$) central phase shift. The 180° phase shift does not affect the in-plane propagating (guided) light, as the field round trip through the phase shifter is 360° (i.e., the guided field remains antisymmetric). For the same reason, the 180° phase shift region does not affect the DFB/DBR grating, since the lasing occurs at the same wavelength, close to the Bragg wavelength, with or without a 180° phase shift. That is, the 180° phase shift creates no defect in the active photonic lattice. However, for the grating-outcoupled light, the 180° central phase shift region defines two surface emitting regions whose outcoupled fields are out-of-phase with each other, and thus the outcoupling of the guided antisymmetric field provides in-phase (i.e., symmetric) radiated near-field and far-field patterns. These types of devices also allow for relatively large tolerances in device fabrication, providing a practical solution for single (orthonormal)-lobe efficient surface emission from $2^{nd}$-order DFB lasers.

For devices optimized for maximum external differential quantum efficiency, $\eta_d$, the variation of the threshold gain and $\eta_d$ have been studied as a function of the grating duty cycle, $\sigma$, defined as the ratio of $\Delta u$ as part of the grating period. G. Witjaksono, et al., "High-Efficiency, Single-Lobe Surface Emitting DFB/DBR Lasers," Paper TuA3, $14^{th}$ IEEE LEOS. Annual Meeting, 12-15 Nov. 2001, San Diego, Calif. The intermodal discrimination, $\Delta\alpha$, reaches a maximum 113 cm$^{-1}$ for $\sigma$=0.5, while the symmetric mode (S-mode) threshold gain is only 22 cm.$^{-1}$ for $\sigma$=0.4, with a respectable $\Delta\alpha$ value of 52 cm$^{-1}$. In general, it is found that such devices can tolerate some variation in grating duty cycle at a relatively small penalty in slope efficiency.

Gratings with phase shifts can be patterned by e-beam lithography or by holographic exposure of side-by-side negative and positive resists. However, current e-beam lithography allows writing of gratings only 400-600 µm long, and for devices requiring relatively long gratings (e.g., about 1,500 µm), fabrication by e-beam lithography is not advisable. The holographic method has been used to fabricate $1^{st}$-order gratings with quarter-wave (i.e., $\pi/2$) phase shifts, with the transition from negative to positive resists creating a grating phase shift of half the grating period. Using the same method for $2^{nd}$-order gratings naturally provides half-wave (i.e., $\pi$) phase shifts. Semiconductor (GaAs) gratings with $\pi$ phase shifts have been developed using negative and positive resists (G. Witjaksono, et al. paper, TuA3, supra). A transition region is observed, but its width is not that relevant as long as the two grating regions are out-of-phase with each other. That is, the grating phase shift does not necessarily have to be $\pi$; it can be an odd number of $\pi$, since the in-plane propagating (guided) light is unaffected by it.

Two-dimensional (2-D) single-mode, single-lobe surface emitters (horizontal resonant cavity) are ideal high-power ($\geq 1$ W) coherent sources due both to low aspect ratio beams as well as the potential for scaling up the power by the use of coherent coupling of the sources at the wafer level (i.e., monolithically). L. J. Mawst, et al., "2-D Coherent Surface-Emitting Leaky Wave Coupled Laser Arrays," IEEE J. Quantum Electron, Vol. 29, 1993, pp. 1906-1917. Three such types of devices have been reported. One involves angled gratings, K. N. Dzurko, et al., "Distributed Bragg Reflector Ring Oscillators: Large Aperture Source of High Single Mode Optical Power," IEEE J. Quantum Electron., Vol. 29, 1993, pp. 1895-1899; M. Fallahi, et al., "Low Threshold CW Operation of Circular-Grating Surface-Emitting DBR Lasers Using MQW and a Self-Aligned Process," IEEE Photon. Tech. Lett., Vol. 6, 1994, pp. 1280-1282. The third approach uses a curved-grating unstable resonator, S. H. Macomber, et al., "Curved-Grating Surface-Emitting DFB Lasers and Arrays," Proceedings Society of Photo-Optical Instrumentation Engineers," Vol. 3001, 1997, pp. 42-54. However, none of these devices have a built-in dielectric structure for lateral-optical-mode control and stability, and as a result are vulnerable to temperature and carrier induced dielectric-constant variations. An example of such behavior is the unstable resonator device which, while operating single-mode to high peak pulsed power in a single off-normal beam, readily becomes multimode in CW operation due to thermal lensing.

SUMMARY OF THE INVENTION

The semiconductor diode array lasers of the present invention utilize periodic dielectric structures with modulated optical gain, so-called active photonic lattices (APLs), to realize watt-range coherent, surface-emitted powers from 2-dimensional (2-D) horizontal cavity devices with $2^{nd}$ order gratings of novel design. In contrast to conventional APLs, the devices in accordance with the invention have gain in the low-index lattice sites, enabling long range (coherent) coupling by traveling waves utilizing resonant leaky-wave coupling between the low-index lattice sites, which had previously only been possible for 1-dimensional edge-emitting structures (so-called antiguided array structures).

The antiguided array structures of the present invention for the lateral dimension preferably have large index steps (e.g., $\Delta n \approx 0.10$), which ensure optical-mode stability against carrier and thermal induced dielectric-constant variations. The 2-D devices of the present invention combine antiguided phase locked arrays with surface emission from 2nd-order DFB/DBR grating structures. Unlike prior 2-D $2^{nd}$ order grating DFB/DBR surface emitters, the present invention may utilize grating phase shifts around 180°, via a discrete central phase shift or a phase shift distributed along the length of the grating (e.g., a chirped grating), or a $\pi$-phase shifting surface film, to provide emission in a single lobe beam at no penalty in device efficiency. The grating structure, beside ensuring single longitudinal-mode operation, can be formed to act as a highly efficient selector of a single lateral mode, the in phase array mode. As a consequence, large aperture (e.g., 200 µm×1200 µm to 400 µm×1 cm) coherent laser diode sources in accordance with the invention have nearly uniform 2-D guided-field profiles and thus are able to operate in a stable, single diffraction-limited beam to watt-range CW output powers. Beam circularization can then be readily obtained utilizing commercially available optical components.

The present invention enables CW watt-range, stable, single mode laser light sources that may be utilized for applications such as room-temperature CW mid-IR ($\lambda$=3-5 µm) coherent light generation (via frequency up-conversion) that can provide several orders of magnitude increases in the sensitivity of laser-absorption spectroscopy for a wide array of non-invasive medical diagnostics (e.g., breath analysis), and for IR countermeasures; for the generation of hundreds of mWs of blue light via harmonic conversion for applications such as in biotechnology (e.g., flow cytometry) and for laser projection systems; for high-power low-noise, high-fidelity RF optical links; and for coherent free-space optical communications. The devices of the present invention are single frequency and thus ideally suited for scalability at the wafer level (via resonant leaky-wave coupling) to 20 units or more. This enables all-monolithic laser light sources capable of providing tens of watts of coherent, uniphase power for various applications, such as high-efficiency, high resolution magnetic resonance imaging with noble gases.

The surface-emitting devices of the present invention have the advantages over edge-emitting devices for the generation of high (greater than 1 W) CW coherent powers that: complete passivation of the emitting area is not needed for reliable operation, scalability at the wafer level becomes possible, and packaging is significantly simplified.

The semiconductor diodes of the present invention preferably utilize gain in the low-index lattice sites, which in turn allows long range coherent coupling via traveling waves. An effective $\pi$ phase shift may be implemented to provide single-lobe operation. For example, the use of a $\pi$ phase shifter centrally located in a second order grating serves to provide single-lobe, orthonormal beam emission with high efficiency (greater than 60%), and the use of gratings with dual spatial-mode selectivity provides both conventional longitudinal-mode selection and strong lateral-mode selection for phase-locked antiguided arrays. A grating with a continuously varying phase shift along the length of the grating may also be utilized to achieve single lobe operation. In the lateral direction, spatial coherence is obtained by using a phase-locked antiguided array, which corresponds to a 1-dimensional active photonic lattice, and using traveling waves for element coupling. The coupling is resonant and long-range by having the high-index regions correspond to an integral number of lateral half waves, thus making the structure fully transmissive. Although the index step may be relatively small compared to those commonly used in photonic lattices, photonic bands and band gaps are formed. Such devices are in effect lateral $2^{nd}$-order complex coupled DFB structures whose $2^{nd}$ diffraction order provides lateral coupling while the $1^{st}$ diffraction order provides propagation in a direction parallel to the array elements and edge emission for edge emitting devices. At lateral resonances, the second order Bragg condition is exactly satisfied, and the stopgaps disappear, i.e., at resonance, full transmission across the photonic lattice is allowed, effectively making such devices photonic band pass devices. At resonance, antiguided arrays become pure gain-coupled DFBs, which are well known to have no stopgaps and thus will lase at the Bragg frequency. Strong light absorption in the interelement regions provides discrimination of modes with significant interelement field, thus favoring the in-phase mode.

In the longitudinal direction, coherence is obtained by using a $2^{nd}$-order grating with a DFB region for gain, partial feedback and outcoupling, and DBR regions for strong frequency-selective feedback and partial outcoupling, effectively providing a second order photonic band gap structure with light outcoupling. Unlike microcavity PBG structures with built-in lattice defect (defect lasers), the photonic band gap structure in the present invention does not have lattice defects, thus allowing for full transmission of light over large distances and thus permitting the generation and surface emission of high coherent power from large apertures. Thus, the present invention combines $2^{nd}$-order photonic lattices in both the lateral (PBP structure) and the longitudinal (PBG structure) directions. The two lattices are interconnected in that the longitudinally-placed gratings act as a highly effective selector of the desired traveling-wave mode in the lateral direction—the in-phase array mode.

Further objects, features and advantages of the invention will be apparent from the following detailed description when taken in conjunction with the accompanying drawings.

DETAILED DESCRIPTION OF THE INVENTION

Figure 1:
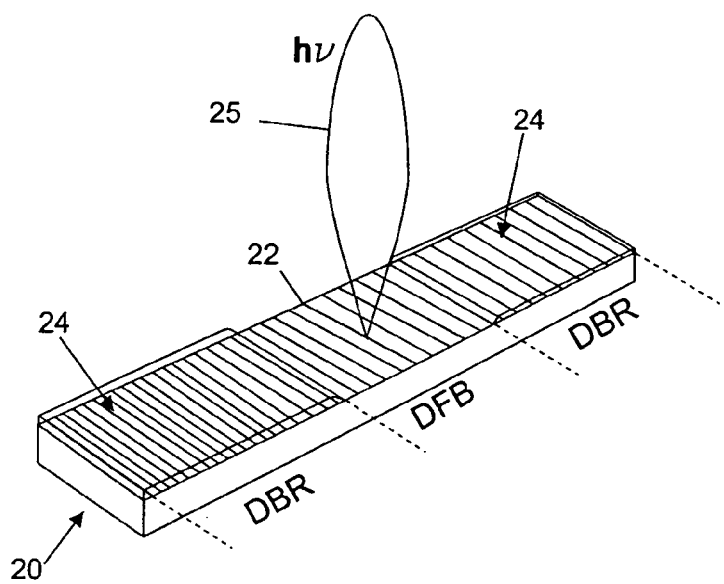
FIG. 1 is a simplified perspective view of a surface-emitting DFB/DBR device operating in a single, orthonormal beam that may be utilized as an array element in the semiconductor diode laser of the present invention.

For purposes of illustrating the invention, a single surface-emitting DFB/DBR device element that may be utilized in the laser diode array of the invention is shown generally at 20 in FIG. 1. This type of device includes a distributed feedback (DFB) grating structure 22 bounded longitudinally by two distributed Bragg reflectors (DBRs) 24. Operation in a single orthonormal beam (illustrated at 25) can be attained utilizing at or near a half-wave (π) central grating phase shift in the DFB grating 22. A particular embodiment of a semiconductor laser structure of this type is shown for exemplification in FIG. 2, although it is understood that other devices of this type may also be utilized, as described, for example, in published International Application WO 01/13480 and U.S. Pat. No. 6,810,053. As discussed further below, single beam operation can also be obtained utilizing a grating with a distributed phase shift or a π-phase shift film on the output surface of a device whose grating has no phaseshift.

Figure 2:
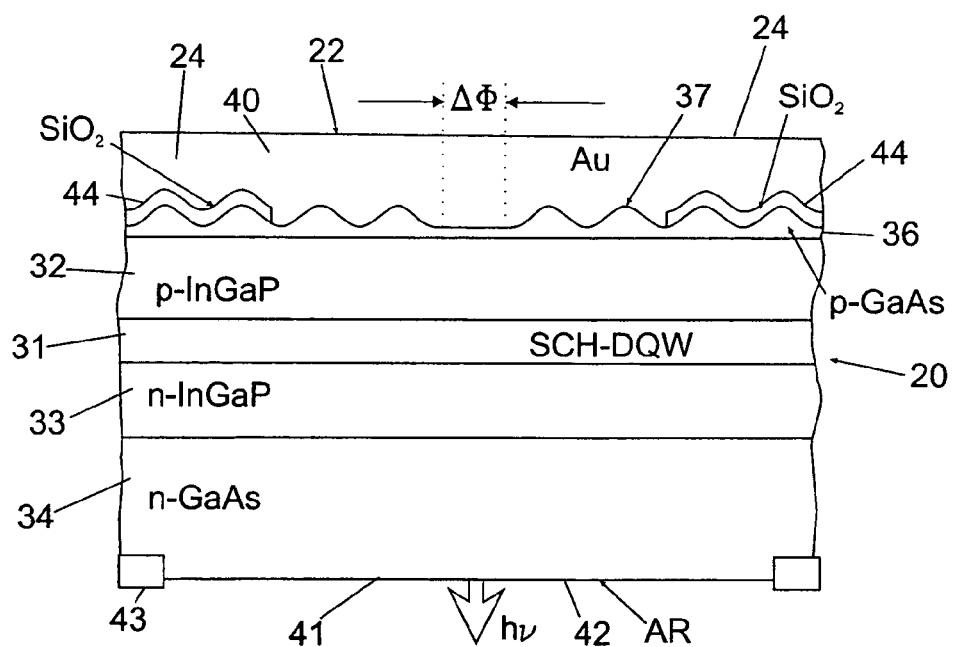
FIG. 2 is a schematic cross-sectional view of an exemplary semiconductor laser element of the type shown in FIG. 1 that has a sinusoidal-shaped grating.
Figure 3:
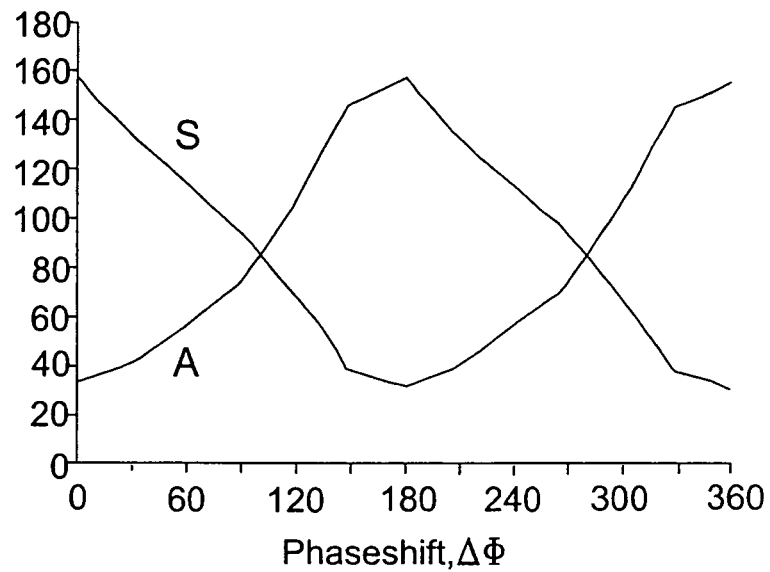
FIG. 3 is a computed graph of the mode discrimination for the device of FIG. 2 as a function of the central phase shift value, $\Delta\phi$.

The illustrative structure shown in FIG. 2 has a double-quantum-well InGaAs/InGaAsP active region 31 with InGaP cladding layers 32 and 33, a GaAs substrate 34, a GaAs cap layer 36, and a grating 37 formed of GaAs/Au by etching in the p$^+$-GaAs cap layer 36 followed by a deposition of gold shown as a layer 40, which provides both high coupling coefficient (κ) as well as ensuring that all first-order diffracted light is collected. The layer 40 also serves as the metal contact electrode on the device p side. Light exits from an antireflective-coated surface 41 of the substrate 34 which is exposed by an opening 42 in a bottom electrode 43. Modeling was carried out with the grating 37 assumed to have a sinusoidal shape as illustrated in FIG. 2. The modeled device included silicon dioxide insulating layers 44 in the DBR regions 24 that serve to direct current to the region of the distributed feedback grating 22 to provide optical gain in this region. The edge terminations were assumed to be totally antireflective (zero reflectivity). As shown in FIG. 3, the modeling found that as the central phase shift, $\Delta\phi$, varies between 100° and 280°, the symmetric mode (S) is favored over the antisymmetric mode (A), with maximum discrimination occurring at $\Delta\phi=180°$. For analysis, the model used both the coupled-mode theory as well as the transfer-matrix method. The carrier-induced depression is taken into account, and the coupling coefficients are $\kappa_{DFB}=-5.46+i49.42$ and $\kappa_{DBR}=2.75+i30.46$ for devices with 0.3 µm-thick p-InGaP cladding and a 0.1 µm-thick InGaAsP upper confinement layer. The background absorption coefficient in the DBR regions is taken to be 15 cm$^{-1}$, in agreement with prior experimental results from InGaAs/GaAs DBR devices. An inspection of the differential equations for the right-going, R, and left-going, S, fields as well as of the expression for the (surface-emitted) near-field reveals that a phase shift value of 180° is equivalent to placing a $\pi$ phase-shift film on half of the emitting area; that is, a 180° central phase shift affects only the grating-outcoupled radiation.

Figure 4:
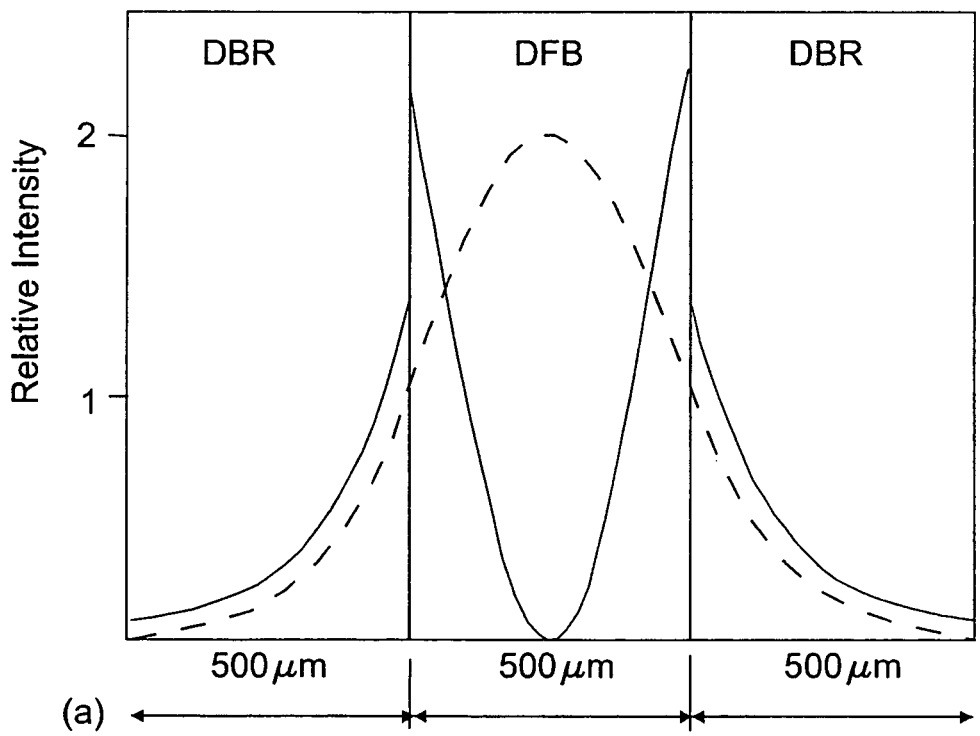
FIG. 4 is a computed graph for the device of FIG. 2 with $\Delta\phi=180°$ showing the near-field profile in the solid curve and the guided-field profile in the dashed curve.
Figure 5:
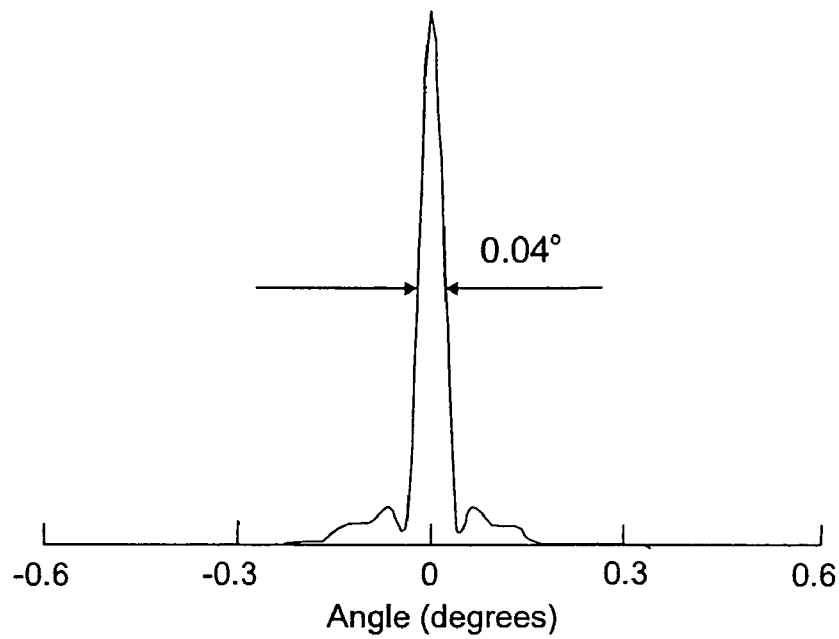
FIG. 5 is a computed graph illustrating the far-field pattern for the device of FIGS. 2 and 4.

For devices with 500 µm-long DFB and DBR regions, FIG. 4 shows the results of the modeling with $\Delta\phi=180°$, showing the near-field (solid curve) and guided-field (dashed curve) profiles. FIG. 5 shows the far-field profile for $\Delta\phi=180°$. The guided-field peak-to-valley ratio, R', in the active (i.e., DFB) region is only 2, which should insure single-mode operation to high power since the mode discrimination is high ($\geq 100$ cm$^{-1}$) as shown in FIG. 3. The far-field consists of an orthonormal beam with 88% of the light in the central lobe.

Figure 6:
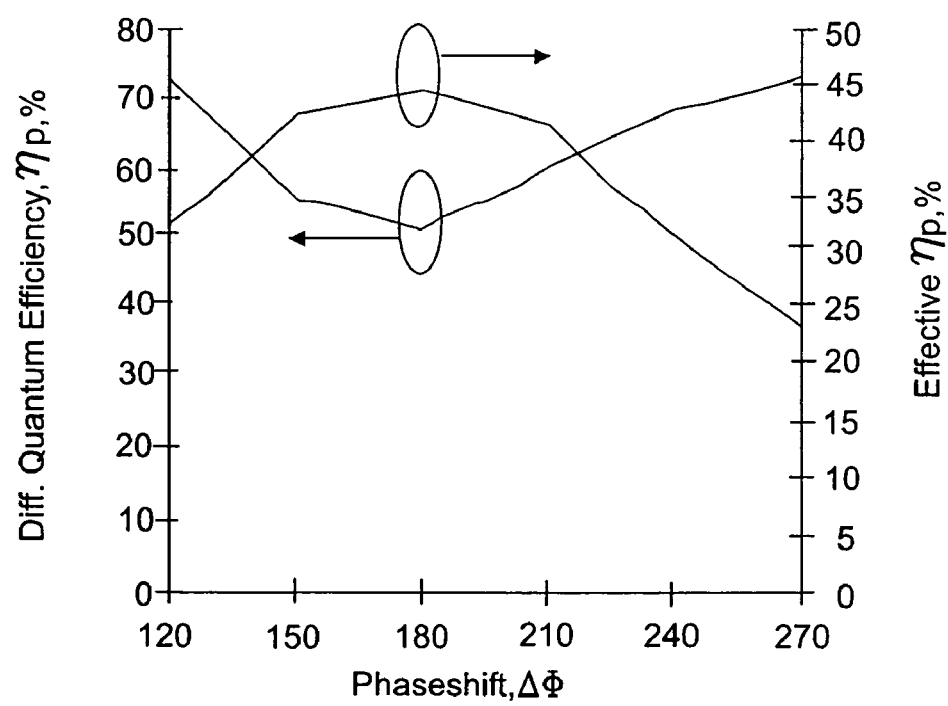
FIG. 6 are computed graphs for the device of FIGS. 2 and 4 showing the differential quantum efficiency, $\eta_d$ and the effective $\eta_d$.
Figure 7:
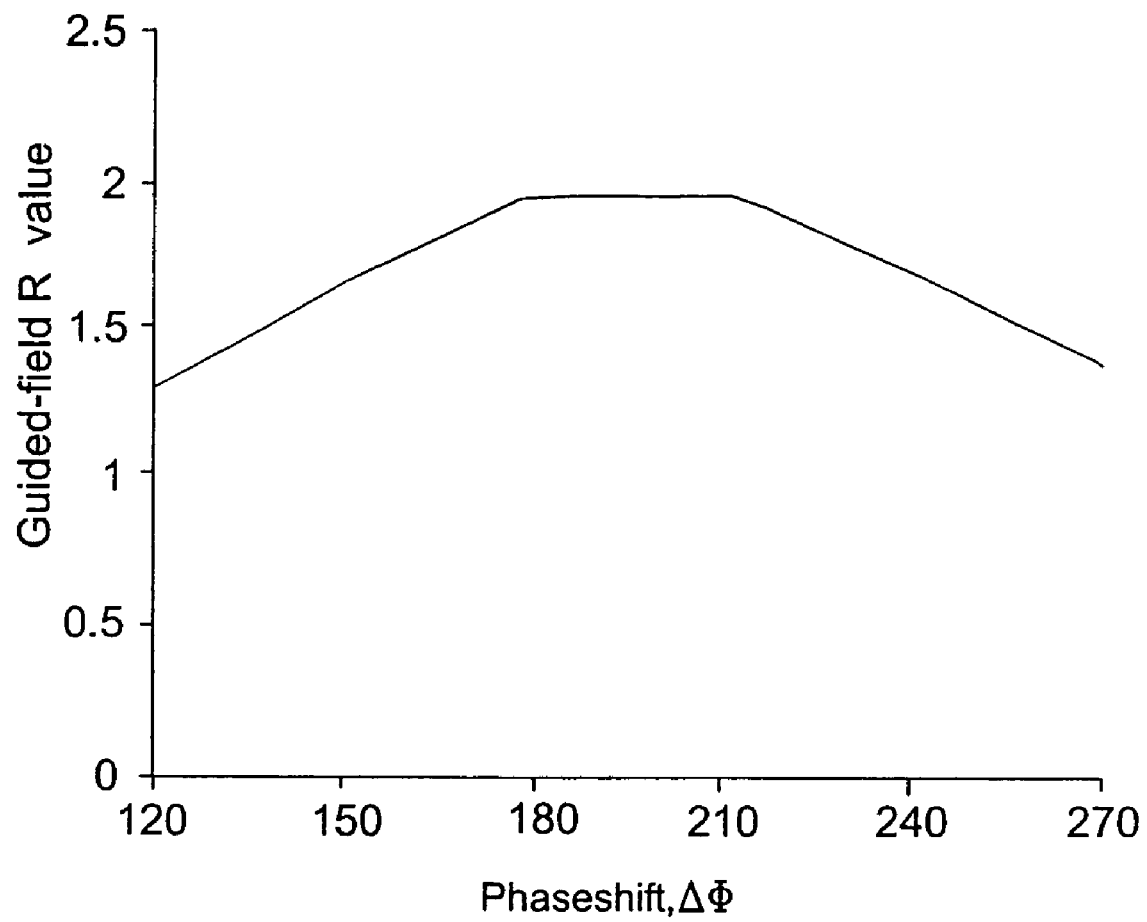
FIG. 7 is a computed graph for the device of FIGS. 2 and 4 illustrating the guided-field peak-to-valley ratio R' in the active (i.e., DFB) region as a function of the phase shift $\Delta\phi$.

At $\Delta\phi=180°$, the differential quantum efficiency, $\eta_D$, is 51%, which reduces to 45% (i.e., effective $\eta_D$) when taking into account the central-lobe energy content. Both $\eta_D$ and the effective $\eta_D$ are plotted as a function of phase shift $\Delta\phi$ in FIG. 6. As for the guided-field, the peak-to-valley ratio, R', while reaching a maximum of 2 at $\Delta\phi=180°$, is seen to decrease to values as small as 1.3 at $\Delta\phi=120°$ and 270°, as shown in FIG. 7. As seen from FIGS. 6 and 7, over a wide range in $\Delta\phi$—in the range of 60°, or within 30° of 180°—the effective $\eta_D$ is relatively high ($\geq 42\%$) and the degree of guided-field uniformity is low (R'<2). These devices are thus capable of providing high single-mode surface emitted power, e.g., >100 mW CW from single-element (e.g., ridge-guide) devices, and >1 W CW from 2-D surface-emitting devices with parallel-coupled phased arrays in the lateral dimension.

Figure 8:
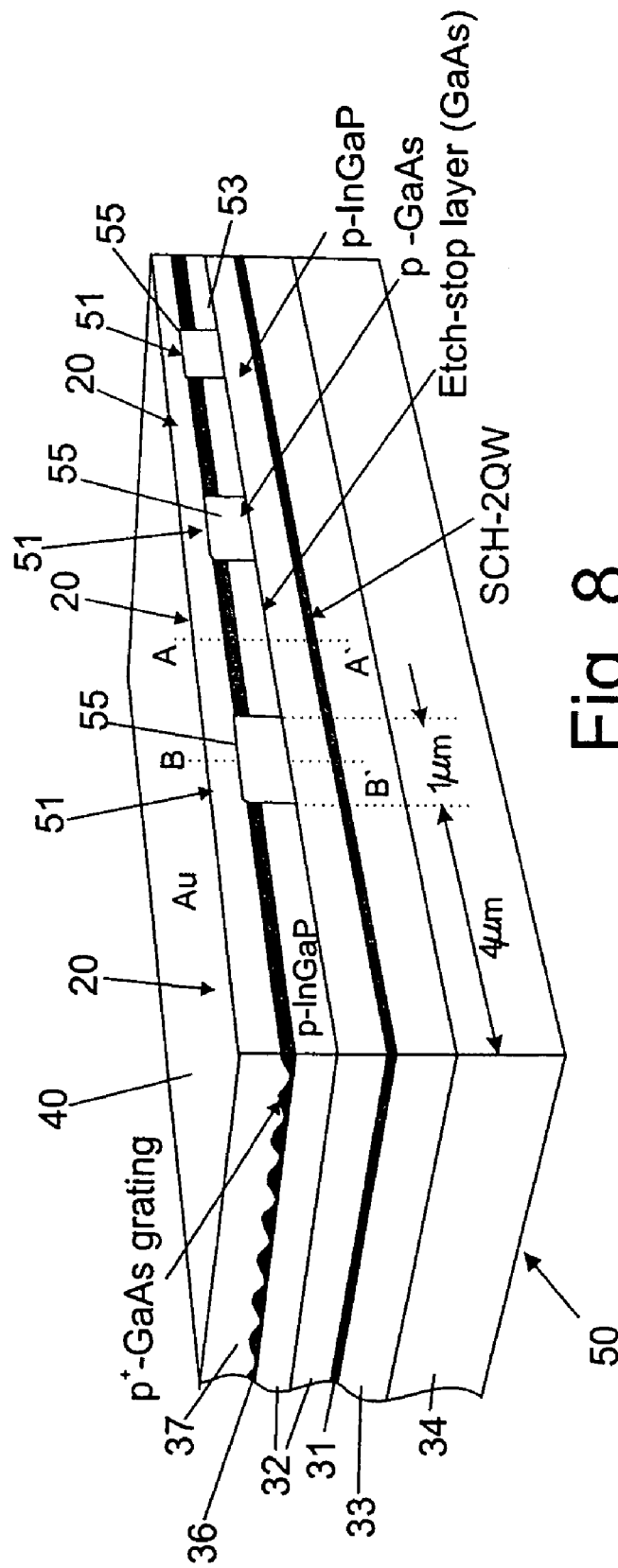
FIG. 8 is a simplified perspective view of an antiguided diode array laser in accordance with the invention having a central phase shift DFB/DBR grating structure.
Figure 9:
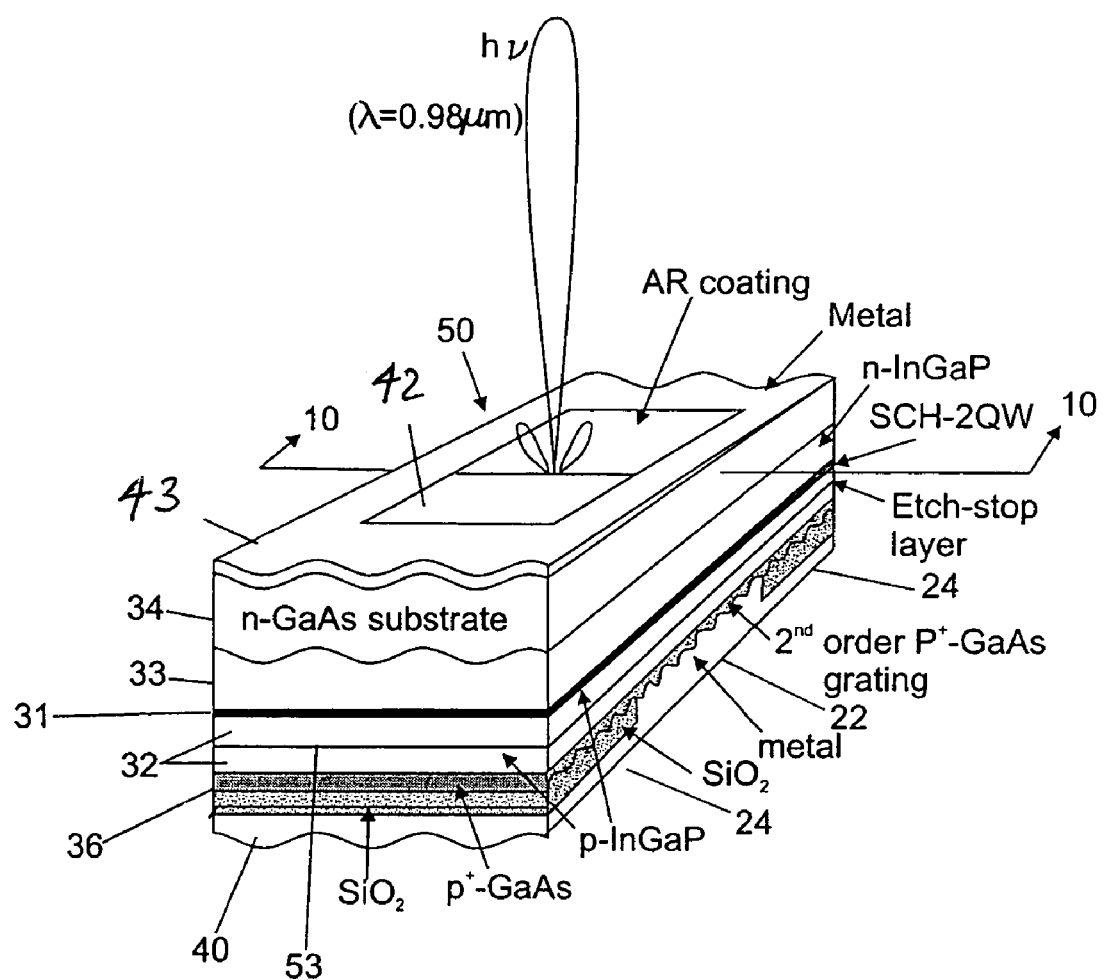
FIG. 9 is a perspective view of the device of FIG. 8 illustrating emission from the surface of the substrate of the device.
Figure 10:
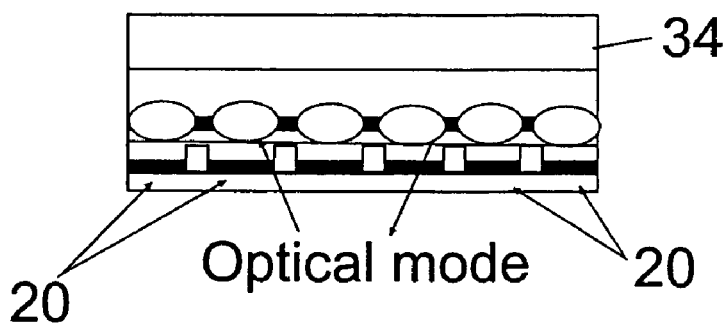
FIG. 10 is an illustrative cross-sectional view of the device of FIG. 9 taken generally along the lines 10-10 in FIG. 9.

With reference to FIG. 8, a semiconductor array laser device in accordance with the invention is shown generally at 50 and employs a DFB/DBR structure (in the longitudinal direction) for providing feedback and efficient coupling. Each element of the array in the lateral direction may comprise, for example, the DFB/DBR structure 20 of FIGS. 1 and 2 laterally spaced and separated by interelement regions 51. An etch stop layer 53 of GaAs is provided to divide the p-InGaP layer 32 to allow etching down to the stop layer 53 in the interelement regions 51 and regrowth with p-GaAs to form interelement regions 55 separating the gratings in adjacent elements 20. Using SiO$_2$ as a mask for etch and regrowth, the 1 µm-wide GaAs regions 55 are periodically introduced in the lateral direction to form high (effective) index interelement regions 51 for an antiguided array. The thin GaAs stop-etch layer 53 is used for controlling the depth of the periodic etching. The GaAs regions 55 preferably have a varying p-type doping concentration: a medium doping concentration (10$^{17}$ to 10$^{18}$ cm$^{-3}$) from the stop-etch layer to within 0.05-0.10 µm from the region's top surface. The rest, a 0.05-0.10 µm-thick layer, is heavily doped (10$^{19}$ to 10$^{20}$ cm$^{-3}$) with Zn or C to form a cap layer for good electrical contact to the metal electrode. After regrowth of the GaAs regions 55, made easy by the use of Al-free (i.e., InGaP) cladding-layer material 32, the SiO$_2$ stripes are removed, and the n-side of the 2-D source is metallized as shown in FIG. 9 to provide a metal electrode 43 so that current may be applied across the device between the electrode 43 and the gold electrode layer 40. The gold electrode layer 40 makes electrical contact with the semiconductor only over a longitudinally restricted region, which constitutes the DFB region of the laser (as shown in FIGS. 2 and 9). Outside of that region the gold layer covers insulating SiO$_2$ layers, which are above the DBR regions of the laser, as seen in FIG. 9, to direct current to the regions of the distributed feedback grating. Any other suitable structures for directing current to the DFB grating regions (e.g., back-biased junctions, etc.) may be used. To insure good adhesion of the metal electrode to the SiO$_2$ layers, about 20 Å of Ti and about 20 Å of Pt may be placed by evaporation and liftoff, prior to the Au deposition, on the SiO$_2$ layers. The output light is emitted through an AR-coated contact-stripe surface of the surface of the substrate defined by a window opening 42 in the electrode 43 on the substrate n-side as shown in FIG. 9. The positions of the optical modes are illustrated in the cross-sectional view of FIG. 10.

To completely suppress reflections from the cleaved chip ends, absorbing material (InGaAs) can be introduced (via etch and regrowth) at the DBR-reflector ends. This prevents disturbance of lasing in the DFB (active) region due to back reflections with random phase from the DBR-reflector ends. Even though the guided field is relatively small at the DBR ends, random-phase reflections can propagate through the mostly bleached DBR reflectors (the mode absorption coefficient is only $\approx 15$ cm$^{-1}$ when considering a bulk absorption coefficient of 200 cm$^{-1}$) and affect lasing in the DFB region.

Figure 11:
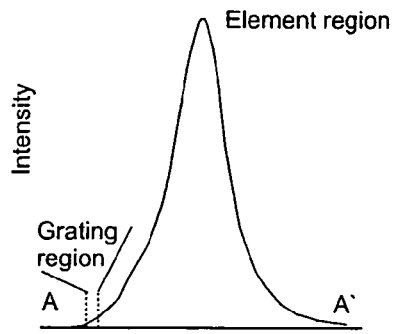
FIG. 11 is a graph illustrating the transverse field-intensity profile in the array element regions ($n_{err}=3.28$) of the device of FIGS. 8 and 9.
Figure 12:
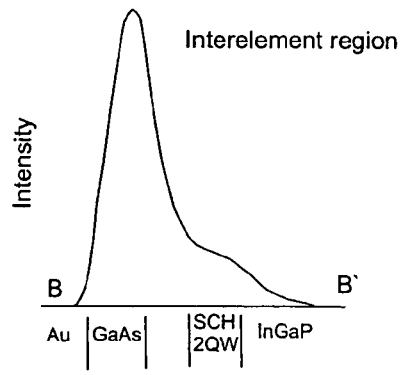
FIG. 12 is a graph illustrating the transverse field-intensity profile in the interelement regions ($n_{eff}=3.34$) in the device of FIGS. 8 and 9.

Calculations were performed for a structure incorporating the grating and GaAs regrowths of various thicknesses. FIGS. 11 and 12 show results for a device with 0.28 µm-thick GaAs regrowths 55. The transverse field intensity profiles in the array element regions 20 [low effective index (3.28)] and interelement regions 51 [high effective index (3.34)] are shown in FIGS. 11 and 12. The index step is high (i.e. 0.06), thus insuring stability against thermal-and carrier induced dielectric-constant variations; and corresponds to the resonance condition for a structure of 1 µm-wide interelement spacings (width of the interelement regions 51).

An important feature of the array device of the invention is that the gratings provide feedback only in the array element regions 20. That happens because, after the creation of the high-index (GaAs) regions 55, the gratings remain only in the low-index element regions 20. Then the in-phase resonant mode, which has most of its field ($\approx 95\%$) in the element regions 20, is favored to lase over the out-of-phase mode, which has significant interelement field. That is, the grating has a triple role: a) feedback; b) outcoupling, and c) selecting operation in the in-phase (lateral) array mode. This array-mode selection mechanism substantially eliminates the need for interelement loss and/or Talbot-type spatial filters to suppress out-of-phase mode operation, thus avoiding self-pulsations due to saturable absorption and GSHB, respectively. The use of preferential feedback as the array-mode selector for 20-element edge-emitting devices has previously been demonstrated by using a continuing grating placed below the active region. See M. P. Nesnidal, et al., IEEE Photon. Tech. Lett., supra. The yield for such devices was low because, in edge emitting devices, the intermodal discrimination is a strong function of the grating phase(s) with respect to the cleaved mirror facet(s).

In the present invention, the mode selection is strong (the grating exists only in the element regions) and there are no grating phase effects, since the reflectors are of the DBR type. Therefore, the yield of in-phase-mode array operation for the devices of the present invention can be quite high.

Further discrimination against oscillation of modes with significant interelement field, such as the out-of-phase mode, is achieved via a strong light absorption in the heavily doped ($10^{19}$ to $10^{20}$ cm$^{-3}$) top parts of the p-GaAs regions 55. Unlike conventional antiguided arrays, such absorption cannot be saturated since carriers created due to absorption quickly transfer to the metal electrode.

20-element ROW arrays ($\approx$100 μm aperture) easily operate in a single array mode, since there is effective discrimination against the out-of-phase mode as well as against the closest array mode to the in-phase mode: the so-called upper-adjacent mode. For the latter, one relies on higher edge radiation losses for the upper-adjacent mode than for the in-phase mode. In order to obtain more coherent power as well as a relatively low beam aspect ratio (for 2-D devices) amenable to easy beam circularization with off-the-shelf optical components, a 200 μm aperture (i.e., 40-element arrays) is desirable. However, the array edge radiation losses scale inversely proportional with the number of elements, with the result that 40-element devices usually operate simultaneously in two modes: the in-phase and upper-adjacent ones, thus providing beams with lobe widths twice the diffraction limit.

Figure 13:
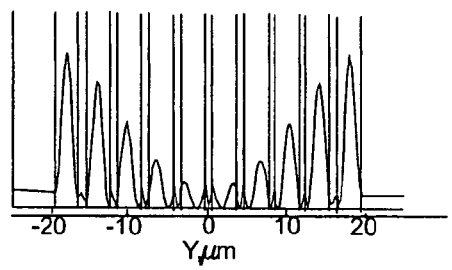
FIG. 13 is a graph illustrating the near-field intensity profile of the upper adjacent array mode of a 10-element ROW array.
Figure 14:
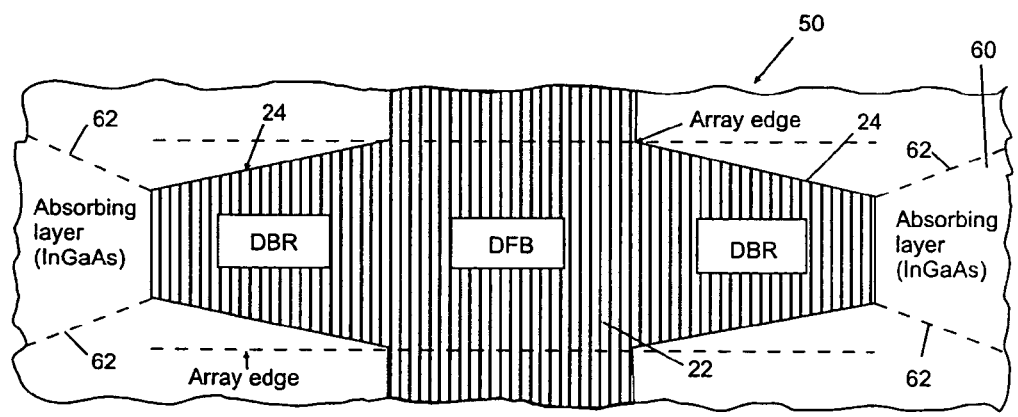
FIG. 14 is a plan view of a laser diode array structure in accordance with the invention that is arranged for suppressing oscillation of the upper-adjacent mode of 40-element ROW arrays.

The grating of the present device suppresses the upper-adjacent mode only at or very close to perfect resonance, where the mode has significant interelement field. However, at the point of maximum discrimination via edge losses (still quite close to the in-phase mode resonance) the upper-adjacent mode has negligible interelement field and it is peaked at the array edges as shown in FIG. 13. To insure its suppression, it is possible, for devices with a large number of elements such as 40-element devices, to taper the DBR-grating regions 24 in the longitudinal direction as shown in FIG. 14, such that the upper-adjacent mode "sees" much less reflection from the DBR sections than the in-phase mode. To insure no back reflections from InGaAs absorbing regions 60 introduced at the DBR-region ends, the edges 62 of the absorbing regions 60 may be angled, e.g., at 45° in the tapered-grating regions, as shown in FIG. 14. Thus, light transmitted through the DBR at various points along the taper will be deflected, insuring that no back reflections can upset the device operation. Thus, because the gratings are formed only in the element regions 20, and with the DBR-reflector tapering suppressing the upper-adjacent mode pure diffraction-limited-beam operation from many element (e.g., 40-element) devices is obtained.

Another feature of the invention, due to the surface-emitting nature of the device, is that only the fields in the array element regions 20 are outcoupled. Thus, for the in-phase resonant mode, only in-phase fields are outcoupled, which in turn provides higher central-lobe energy content (78%) in the far-field pattern than in the case of an edge-emitting array of similar geometry (63%). Thus, the overall 2-D effective quantum efficiency (i.e., $\eta_D$ multiplied by the percentage of energy radiated in the single orthonormal lobe) can reach values as high as 42%.

Exemplary devices may utilize 20-element arrays with 4 μm-wide elements 20 and 1 μm wide interelements 51, thus providing a 100 μm-wide lateral dimension for the 2-D source. Longitudinally, the structure shown in FIG. 2 (e.g., with ≈1300 μm equivalent aperture) can be used to outcouple the light. For more power and better beam aspect ratio, 40-element devices (i.e., 200 μm-wide array) may be used, together with 1200 μm-long DFB/DBR gratings. Then the beam aspect ratio is only 6, which allows for easy beam circularization with commercially available anamorphic prism pairs.

Figure 15:
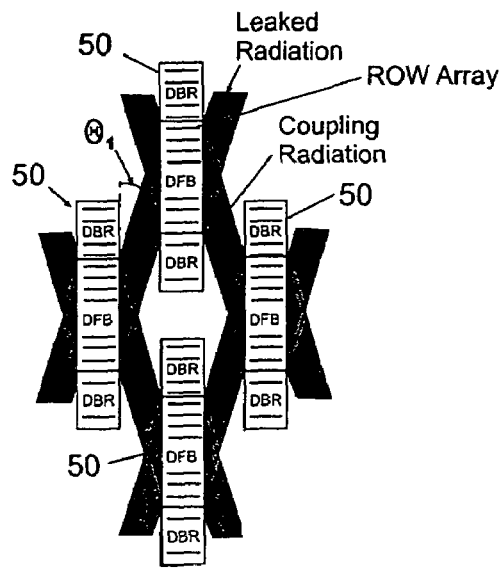
FIG. 15 is a simplified plan view of a scaled array device in accordance with the invention in which individual devices are coupled in the array.
Figure 16:
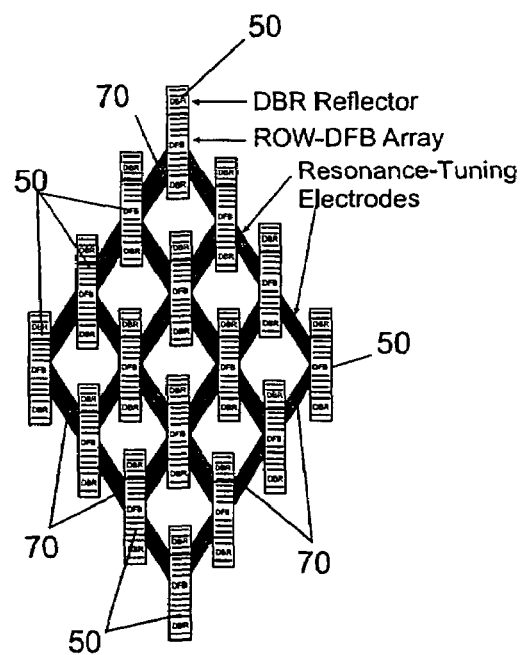
FIG. 16 is an array as in FIG. 15 having 16 laser diode array units.
Figure 17:
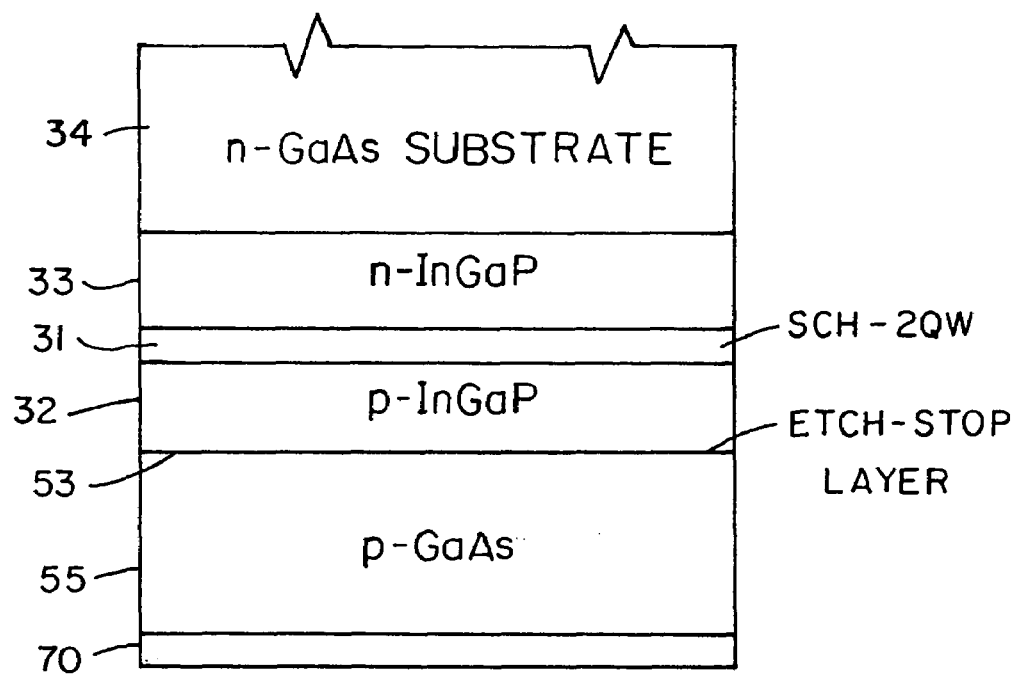
FIG. 17 is a simplified cross-sectional view through the interdevice regions of the array of FIG. 16.

For an antiguided array, radiation leaks at its edges by refraction. In turn, 2-D surface emitters can be coupled via leaky waves in diamond-shaped 2-D configurations across the wafer surface. Since ROW arrays leak radiation laterally at predetermined angles (8-10° for an index step of $(3-5)\times10^{-2}$), a diamond-shaped configuration for which four ROW arrays 50 are mutually coupled can be formed as shown in FIG. 15. The laser devices may have tapered DBR-grating regions and light absorbing layers outside the DBRs as shown in FIG. 14. Each of the four ROW arrays has its own electrode, like the one shown in FIG. 8, making electrical contact to their respective DFB regions. Radiation is outcoupled through the substrate via the DFB/DBR gratings. Interdevice electrodes 70 can be provided, as shown in FIG. 16, that ensure, via carrier-induced changes in the dielectric constant, that adjacent units are resonantly coupled. In the interdevice regions, the grown structure has the same structural composition as that for the interelement regions of ROW arrays (see cross-section in FIG. 12) as shown in FIG. 17. In order to provide independent current injection of the ROW arrays and the interdevice electrodes 70, narrow (~3 μm wide) electrical-isolation trenches may be etched through the upper p-cladding layers. In the case of array devices with tapered DBR regions, as shown in FIG. 14, the same steps are taken except that the DFB regions extend laterally only to the array edges. Leaky-wave coupling of ROW arrays over large distances (90-176 μm) has previously been demonstrated in both linear configurations as well as 2-D configurations. The 2-D configurations involved Fabry-Perot lasing cavities (defined by micromachined mirror facets) and light-deflection in a direction normal to the chip surface via 45° micromachined turning mirrors. Micromachined diode-laser mirror facets were used only for concept-proving purposes. Otherwise, using 45° micromachined turning mirrors is a surface emitting method which does not provide any phase control, since micromachining cannot provide beam deflectors equally spaced, within a fraction of a wavelength, from the laser's emitting facets. Furthermore, because the ROW arrays had lasing cavities of the Fabry-Perot type, the devices' individual frequency spectra were multimode, which in turn led to a rather poor degree of overall coherence, 35% fringe visibility, for the 2-D configuration.

Using the 4-unit diamond-shaped configuration of FIG. 15 as a building block it is possible to build larger 2-D arrays (e.g., 16 units as shown in FIG. 16) all phase-locked via resonant leaky-wave coupling, and mutually frequency-locked sources operating at the same frequency. Thus, full coherence, 100% fringe visibility, can be achieved, in contrast to the previously demonstrated 2-D configurations involving phase-locking of array units having Fabry-Perot cavities. For 16-unit devices, the fact that most array units resonantly couple to three or four nearest neighbors is very much like the global-coupling mechanism of individual antiguided elements in ROW arrays. As opposed to previous 2-D array schemes, which could at best achieve 150 mW of diffraction-limited uniphase power, the 2-D ROW-DFB array of the invention has three significant advantages: (1) it provides phase locking in addition to frequency locking, (2) it represents a global-coupled 2-D monolithic array; and (3) the interunit coupling is independent of the feedback and/or beam-outcoupling mechanisms.

Scaling at the wafer level can be extended to at least a 25-unit 2-D array. However, due to unavoidable layer thickness and/or composition nonuniformities across the array, full coherence may be difficult to maintain when the 2-D array has more than approximately 25 units. To provide full coherence in arrays with large numbers of elements, a single frequency master oscillator (MO) may be utilized. The MO can be a single-frequency laser monolithically integrated on the wafer or an external single-frequency laser. In either case, an optical isolator should be provided between the MO and the 2-D array to insure that no back reflections affect the MO operation as a single-frequency laser.

The ability to reliably provide watts of surface-emitted, CW single-frequency, diffraction-limited power allows a wide variety of applications. Particularly attractive is the fact that, compared to edge-emitters, surface-emitting (SE) sources can be tested at the wafer level, are relatively easy to package, and are not subject to facet degradation (i.e., are more reliable). A major application involves using parametric frequency conversion to the mid-IR spectral range ($\lambda$=3-5 $\mu$m). Room-temperature CW mid-IR coherent light is valuable for noninvasive medical-diagnostics techniques based on laser-absorption spectroscopy such as breath analysis and body-fluid analysis. For breath analysis the sensitivity may be increased by 3 orders of magnitude to detect most vital-organ malfunctions, metabolic disorders, and (invisible) traumas. In turn, doctors can use small, portable units for immediate diagnostics in their offices or during critical times such as surgery. For body-fluid analysis such lasers may be utilized for quick and highly sensitive detection of organic-analyte (glucose, cholesterol) levels. Another application of CW room temperature mid-IR lasers is for IR countermeasures, for which the use of lightweight, high-efficiency, small sources is crucial.

The invention may also be utilized in the generation of blue light via second harmonic generation. The bandwidth needed varies from $\approx$13 Å for inefficient ($\approx$10%) doubling crystals to $\approx$1 Å for highly efficient ($\approx$50%) resonant doubling crystals. By using ROW-SE-DFB devices, hundred of milliwatts of blue light may be generated for use in such applications as laser-beam projection; high-speed, high-density optical recording; and especially biotechnology (flow cytometry, capillary electrophoresis, etc.).

For free-space optical communications to supplant RF-based technology, coherent optical communications schemes need to be implemented. ROW-SE-DFB arrays can provide the power (~1 W), narrow-linewidth ($\approx$1 MHz), and modulation bandwidth (1-2 GHz) needed for such systems. There would be no need for the external phase-corrective feedback mechanisms that are necessary if MOPA-type sources are to be used, and reliability will be assured by the ROW-array intrinsic stability. Other applications are as sources for high-power low-noise, high-fidelity RF links, differential-absorption LIDAR, and coherent ranging over long distances.

Scaling at the wafer level can provide tens of watts of coherent power. Many uses are possible. These include significant increases in the efficiency as well as the resolution of MRI with noble gases, a novel medical-diagnostics technique that allows high-resolution imaging of the lungs and the brain. The technique has $\approx 10^6$ higher resolution than conventional MRI.

Figure 18:
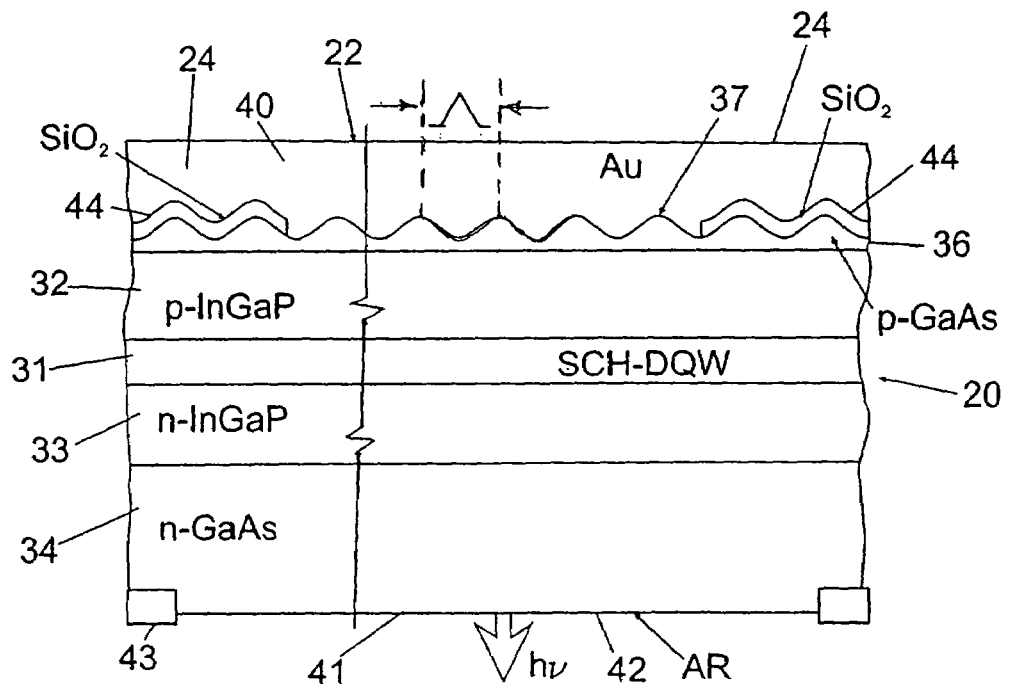
FIG. 18 is a schematic cross-sectional view of another exemplary semiconductor laser element of the type shown in FIG. 1 having a grating with a slowly varying period along the length of the grating.

Generally, the output power available from the high-powered 2-D surface emitting laser array of the invention is proportional to the area of the emitting aperture. For the array devices shown in FIG. 8, a 40-element resonant anti-guided array will have a lateral dimension of about 200 $\mu$m. The longitudinal dimension corresponds to the width of the emission from the second order DFB grating 22 and the DBR gratings 24, with typical total longitudinal dimensions of about 1,500 $\mu$m. Devices of such dimensions are capable of providing single mode output power in the range of about 3 watts. To provide higher output powers from a single array device 20 (as opposed to a coupled array of such devices as shown in FIGS. 15 and 16) it is necessary to increase the emitting area of the device, inasmuch as the output power scales approximately in relation to the area of the aperture. For example, to obtain 50-70 watts of coherent output power, it would be necessary to use very long devices, in the range of 1 cm, with lateral dimensions in the range of 300-500 $\mu$m. With very long DFB gratings having a central discrete $\pi$ phase shift, the slope efficiency decreases with the length, and the selection of the desired in-phase array mode due to gratings placed only in the array element regions becomes progressively smaller, since the DBR regions (e.g., each about 500 $\mu$m long) are much smaller than the DFB (e.g., about 9,000 $\mu$m long). For such long structures, a grating can be utilized as illustrated in FIG. 18 that has a continuously and slowly varying period A that creates a distributed phase shift over the length of the DFB grating and DBR gratings as opposed to a discrete $\pi$ phase shift at the center of the DFB grating. Distributed phase shift gratings (which may be referred to herein as "chirped gratings") provide surface emission in a single-lobed beam pattern which is slightly off normal, but stable. For such chirped gratings the slope efficiency does not decrease with increasing device length, and thus the surface emitted power scales with increasing grating length. Such distributed phase shift or chirped gratings are well known and described in, e.g., U.S. Pat. Nos. 5,238,531 and 5,241,556. See also, S. H. Macomber, "Nonlinear Analysis of Surface-Emitting Distributed Feedback Lasers," IEEE J. of Quant. Elect., Vol. 26, No. 12, December 1990, pp 2065-2074; Steven H. Macomber, "Design of High-Power, Surface-Emitting DFB Lasers for Suppression of Filamentation," Proc. of SPIE, Vol. 4993 (2003), pp 37-49.

Figure 19:
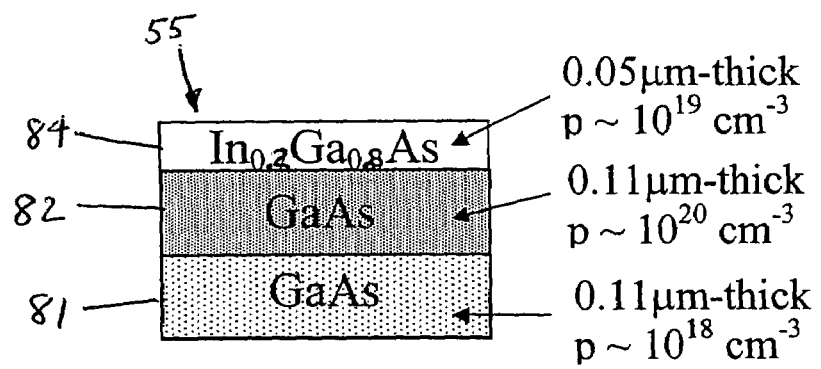
FIG. 19 is a cross-sectional view of an interelement region that may be utilized in the laser diode array of the invention to provide absorption and discrimination against modes with significant interelement field.

In relatively smaller arrays having, e.g., 20-40 laterally spaced elements, lateral edge radiation loss can be used to discriminate against adjacent arrays modes. However, the effect of edge loss as a discriminator against the adjacent array modes decreases with increasing numbers of elements. As discussed above, interelement loss also functions to discriminate against the out-of-phase modes, and strong interelement loss can be utilized to adequately suppress adjacent array modes to allow 60-100 element or more arrays (e. g., 300-500 $\mu$m lateral dimensions). As indicated above, highly doped GaAs as the material 55 in the interelement regions can provide strong absorption and discrimination of the out-of-phase modes. Another example of a interelement region material 55 is shown in FIG. 19, that provides very strong absorption and discrimination, is composed of a first or base layer 81 of GaAs of moderate doping, a second intermediate layer 82 of GaAs that is heavily doped, and top layer 84 of the high-index material InGaAs. The layer of high-index material 84 draws the field towards the top surface and thus causes greater absorption in the layer 84 (the material of the layer 84, InGaAs, is significantly more absorbing that GaAs since it has a lower energy band gap than GaAs) and also causes more absorption in the metal contact above the interelement region which is in contact with the layer 84. The in-phase mode at resonance has about 99 percent of its field in the element, while the other array modes have 70-80 percent of their field in the elements and the rest in the interelement regions. Thus, strong light absorption in the interelement regions suppresses the non-resonant modes while not substantially affecting the resonant in-phase mode.

The grating period Λ, or the phase shift of the grating from its phase at the center of the grating, $\Phi_g$, can be selected to provide the appropriate second order grating feedback and first order grating surface emission. A general expression for the grating function is provided below.

The grating shape is expressed in a polynomial expansion of its phase:

$$\Phi_g(z) = 2\pi \sum_{n=0}^{\infty} C_n (2z/L)^n$$

where:
z is the longitudinal dimension (i.e., the direction along which the grating phase is varying) and: z=0 is at the center of the grating, L is the length of the whole grating, and the coefficients $C_n$ represent the number of waves of phase from the grating center to the grating end for a given n value. For example, for a grating linear period variation, n=2, and then a value of 0.5 for C gives a value of π for $\Phi_g(z)$, which means a half-wave variation over half the grating; that is, a full-wave variation over the whole grating (the variation being linear).

A simple way to explain what the coefficient C stands for is the following:
Assume that z=0 is at the center of the grating and that the gratings's whole length is L. If this $2^{nd}$-order grating is periodic, then L=mλ, where m is an integer and λ is the wavelength of the light in the semiconductor medium. If the grating is a linearly chirped, as described in the above paragraph (i.e., n=2 in the above formula) then L=(m+$C_2$)λ, where $C_2$ is a non-integer number representing the number of waves of phase from the grating center to the grating end. As mentioned above, if one has a full-wave variation (i.e., 2π) over the whole grating, then $C_2$=0.5. For a distributed π phaseshift over the whole grating length, $C_2$=0.25. If the grating is not linearly chirped $$L = \left(m + \sum_{n=0}^{\infty} C_n\right)\lambda, \text{ where } \sum_{n=0}^{\infty} C_n$$

is a non-integer number representing the number of waves of phase from the grating center to the grating end. The case $C_0$ corresponds to a phase constant which has nothing to do with the grating.

Figure 20:
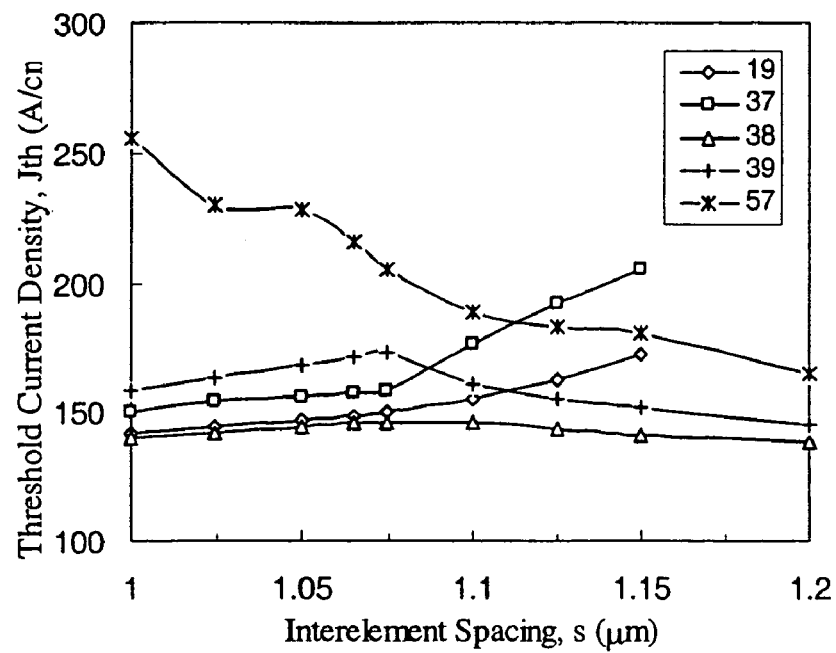
FIG. 20 are graphs illustrating the results of simulations of threshold current densities for various modes in a 20-element laser diode array in which there is no loss in the interelement regions.
Figure 21:
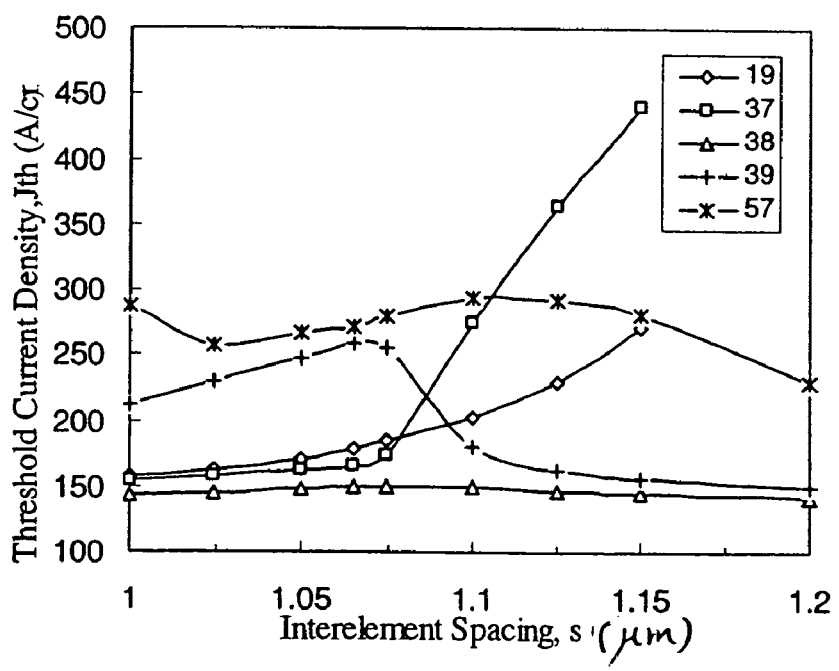
FIG. 21 is a graph showing results of simulations as in FIG. 20 with interelement absorption provided by heavily doped GaAs.
Figure 22:
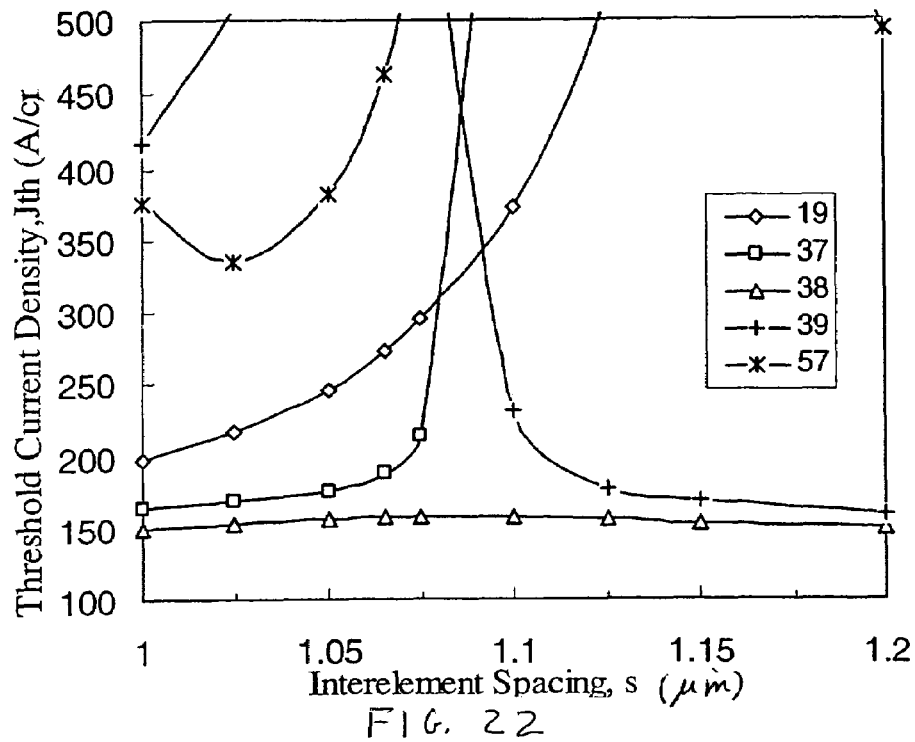
FIG. 22 is a graph showing the results of simulations as in FIG. 20 with the inclusion of an absorbing layer of InGaAs in the interelement regions.
Figure 23:
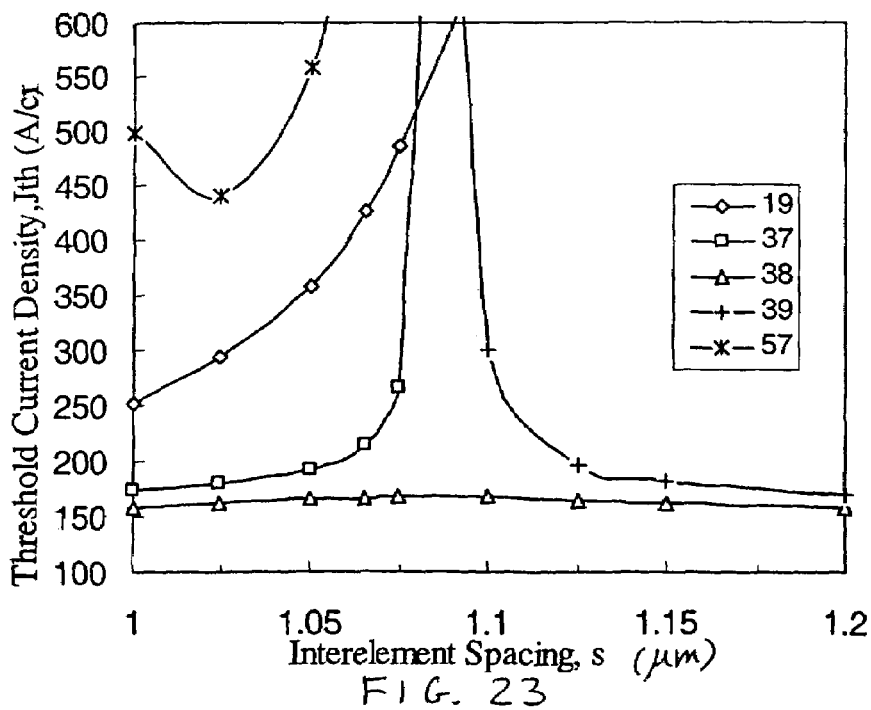
FIG. 23 are graphs showing the results of simulations as in FIG. 20 for interelement regions having both an absorbing layer of InGaAs and heavily doped GaAs in the interelement regions.

FIGS. 20-23 illustrate the results of simulations of a device as shown in FIG. 18 with a chirped grating, having a 20-element array in the lateral direction, and interelement regions which have varying amounts of interelement loss. In each of these figures, Mode 38 is the in-phase mode, and the graphs illustrate the threshold current density as a function of interelement spacing. FIG. 20 shows the results with no interelement loss (showing very little distinction for the threshold current between the in-phase mode and the out-of-phase and adjacent array modes), FIG. 21 shows the affect of interelement absorption by heavily doped GaAs, FIG. 22 shows the effect of interelement absorption in the InGaAs layer 84, and FIG. 23 shows the effect of interelement absorption from the layer 84 and a heavily doped GaAs layer 82. As illustrated in FIG. 23, with the use of the InGaAs layer 84 and heavily doped GaAs, at an interelement spacing in the range of about 1.07 to 1.11 μm only the in-phase mode 38 is the one favored to lase since it has much lower threshold current density than the other modes. The simulations are shown for a DBR/DFB/DBR structure (in μm) in longitudinal direction of 700/8,000/700, with the following materials: 400 nm-thick InGaP upper cladding layer; grating depth: 100 nm, 50 nm-thick InGaAs, 220 nm-thick GaAs, InGaAs absorption coefficient value of 8,000 cm$^{-1}$ and index value of n=3.7; the upper 110 nm of the GaAs regrown material with absorption coefficient of 600 cm$^{-1}$, the lower 110 nm of the GaAs material with absorption coefficient of 10 cm$^{-1}$.

Figure 24:
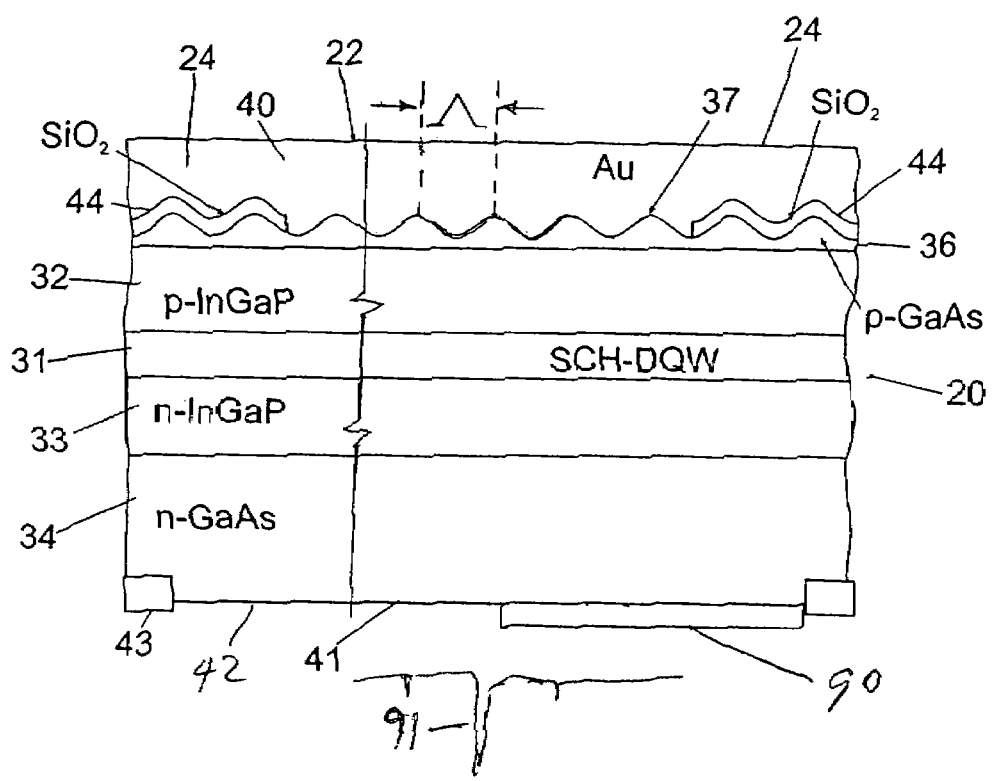
FIG. 24 is a schematic cross-sectional view of another exemplary semiconductor laser element of the type shown in FIG. 1 with a π phase shift layer formed on the output face of the substrate at which the light exits to provide c-phase shift and substantially single lobe output.

A phase shift to obtain a single lobed output can also be obtained as illustrated in FIG. 24 by utilizing a phase shifting film 90 on the output surface 41 of the substrate to provide a single lobed output beam 91. A DFB grating 22 may then be utilized which has a regular periodic grating with a constant period Λ. Such surface films to obtain π phase shifting are described in U.S. Pat. No. 4,805,176 to Botez, et al., entitled "Phase-Locked Laser Array with Phase-Shifting Surface Coating," the disclosure of which is incorporated herein by reference. See also, D. E. Ackley, et al., "Phase-Locked Injection Laser Arrays with Integrated Phase Shifters," RCA Review, Vol. 44, December 1983, pp 625-633; M. Matsumoto, et al., "Single-Lobed Far-Field Pattern Operation in a Phased Array with an Integrated Phase Shifter," Appl. Phys. Lett., Vol. 50, No. 22, 1 June 1987, pp. 1541-1543; and S. H. Macomber, et al., "Recent Developments in Surface Emitting Distributed Feedback Arrays," Proc. SPIE, Vol. 1219 Laser-Diode Technology and Applications II, 1990, pp. 228-232. The phase shifting film 90 is deposited on the output surface above about half of the length of the grating, which serves to shift the beam phase by π. The external, emitted beam 91 thus becomes single lobed rather than the double lobed internal beam.

It is understood that the invention is not limited to the embodiments set forth herein as illustrative, but embraces all such forms thereof as come within the scope of the following claims.

What is claimed is:
1. A semiconductor laser comprising:
(a) a semiconductor substrate;
(b) an array of laterally-spaced laser device elements formed on the substrate, each of the laser device elements extending in a longitudinal direction on the substrate, each laser device element including a second order distributed feedback grating having optical gain and each laser device element having distributed Bragg reflector gratings bounding the distributed feedback grating in the longitudinal direction to reflect light back to the distributed feedback grating, wherein the gratings are confined to the laser device elements;
(c) electrodes by which voltage can be applied across the array and the substrate, and means for directing current to a region of the array containing the distributed feedback gratings of the laser device elements; and
(d) laser device interelement regions on the substrate between the device elements, the device elements in which the distributed feedback grating and the distributed Bragg reflector gratings are formed having a lower effective refractive index than the index of the interelement regions, the interelement regions spacing the device elements by a width such that light propagating laterally from the device elements is fully transmitted between adjacent device elements to form a laterally resonant antiguided array for which the device elements are substantially equally coupled to each other, the inter- element regions having strong light absorption to provide discrimination of modes with significant interelement field.

2. The semiconductor laser of claim 1 wherein the laser device elements and the laser device interelement regions are formed in an epitaxial structure on the substrate including a layer with an active region at which light emission occurs, upper and lower cladding layers surrounding the active region layer, each distributed feedback, grating in the device elements incorporated with the epitaxial structure having a selected phase shift and comprising periodically alternating grating elements to provide optical feedback as a second order grating for a selected effective wavelength of light generation from the active region, the grating having a spacing between adjacent grating elements at a selected position intermediate that corresponds to the selected phase shift in the grating, the grating formed and positioned to act upon the light generated in the active region to produce a lasing action and an emission of light from a lower face of the, substrate of the semiconductor laser, and wherein the distributed Bragg reflector gratings for each laser device element are incorporated with the epitaxial structure adjacent the distributed feedback grating in each laser device element to reflect light back to the distributed feedback grating.

3. The semiconductor laser of claim 2 wherein the electrodes are formed on an upper face and a lower face of the semiconductor laser and for the electrode formed on the upper face current flows through the region that contains the distributed feedback gratings.

4. The semiconductor laser of claim 2 wherein the active region layer is formed of InGaAsP confinement layers and at least one InGaAs quantum well layer between the InGaAsP confinement layers, and the lower and upper cladding layers are formed of n-type InGaP and p-type InGaP, respectively, and the substrate is formed of GaAs.

5. The semiconductor laser of claim 2 wherein the distributed Bragg reflector gratings of each laser device element and the laser device interelement regions have longitudinal ends and including a light absorbing material formed on the structure at the longitudinal ends of the distributed Bragg reflector gratings and interelement regions to absorb light that passes out from the distributed Bragg reflector gratings and the interelement regions to prevent reflections of light back into the laser device.

6. The semiconductor laser of claim 1 wherein the means for directing current flow to the distributed feedback gratings include an insulating layer on the distributed Bragg reflector gratings to inhibit current flow through these gratings.

7. The semiconductor laser of claim 1 wherein one of the electrodes is formed on a lower face of the substrate and has a window opening formed therein to permit light emission therethrough.

8. The semiconductor laser of claim 2 wherein the distributed feedback grating has a central phase shift in the grating within 30° of 180°.

9. The semiconductor laser of claim 1 wherein the interelement regions are formed of highly doped GaAs.

10. The semiconductor laser of claim 1 wherein the interelement regions include a first layer of GaAs of a selected doping type, a second layer of GaAs more heavily doped than the first layer and of the same selected doping type as the first layer, and a top layer of InGaAs.

11. The semiconductor laser of claim 1 wherein the array laterally-spaced device elements have a total lateral dimension of at least 250 μm.

12. The semiconductor laser of claim 1, wherein each second order distributed feedback grating has a chirped period that corresponds to a phase shift distributed across the grating, and the distributed Bragg reflector gratings also have chirped periods which correspond to distributed phase shifts.

13. The semiconductor laser-of claim 12 wherein the laser device elements and the laser device interelement regions are formed in an epitaxial structure on the substrate including a layer with an active region at which light emission occurs, upper and lower cladding layers surrounding the active region layer, each distributed feedback grating in the device elements incorporated with the epitaxial structure comprising periodically alternating grating elements to provide optical feedback as a second order grating for a selected effective wavelength of light, generation from the active region, the grating having spacings between adjacent grating elements that correspond to the selected chirping function of the grating period, the grating formed and positioned to act upon the light generated in the active region to produce a lasing action and an emission of light from a lower face of the substrate of the semiconductor laser, and wherein the distributed Bragg reflector gratings for each laser device element are incorporated with the epitaxial structure adjacent the distributed feedback grating in each laser device element to reflect light back to the distributed feedback grating and which also have spacings between adjacent grating elements that correspond to the selected chirping function of the grating period.

14. The semiconductor laser of claim 13 wherein the electrodes are formed on an upper face and a lower face of the semiconductor laser and for the electrode formed on the upper face current, flows through the region that contains the distributed feedback gratings.

15. The semiconductor laser of claim 13 wherein the active region layer is formed of lnGaAsP confinement layers and at least one InGaAs quantum well layer between the InGaAsP confinement layers, and the lower and upper cladding layers are formed of n-type InGaP and p-type InGaP, respectively, and the substrate is formed of GaAs.

16. The semiconductor laser of claim 13 wherein the distributed Bragg reflector gratings of each laser device element and the laser device interelement regions have longitudinal ends and including a light absorbing material formed on the structure at the longitudinal ends of the distributed Bragg reflector gratings and interelement regions to absorb light that passes out from the distributed Bragg reflector gratings and the interelement regions to prevent reflections of light back into the laser device.

17. The semiconductor laser of claim 12 wherein the means for directing current flow to the distributed feedback gratings include an insulating layer on the distributed Bragg reflector gratings to inhibit current flow through these gratings.

18. The semiconductor laser of claim 12 wherein one of the electrodes is formed on a lower face of the substrate and has a window opening formed therein to permit light emission therethrough.

19. The semiconductor laser of claim 12 wherein the distributed phase shift across the length of all gratings totals about 180°.

20. The semiconductor laser of claim 12 wherein the interelement regions are formed of highly doped GaAs.

21. The semiconductor laser of claim 12 wherein the interelement regions include a first layer of GaAs of a selected doping type, a second layer of GaAs more heavily doped than the first layer and of the same selected doping type as the first layer, and a top layer of InGaAs.

22. The semiconductor laser of claim 12 wherein the array laterally spaced device elements have a total lateral dimension of at least 300 μm.

23. The semiconductor laser of claim 1, further comprising:
(e) a π phase shifting film formed on the substrate at an emission window of the substrate by which light is emitted covering about one half of the emission window to provide a π phase shift and substantially single lobe emission from the emission window of the semiconductor substrate.

24. The semiconductor laser of claim 23 wherein the laser device elements and the laser device interelemnt regions are formed in an epitaxial structure on the substrate including a layer with an active region at which light emission occurs, upper and lower cladding layers surrounding the active region layer, each distributed feedback grating in the device, elements incorporated with the epitaxial structure comprising periodically alternating grating elements to provide optical feedback as a second order grating for a selected effective wavelength of light generation from the active region the grating formed and positioned to act upon the light generated in the active region to produce a lasing action and an emission of light from a lower face of the substrate of the semiconductor laser, and wherein the distributed Bragg reflector gratings for each laser device element are incorporated with the epitaxial structure adjacent the distributed feedback grating in each laser device element to reflect light back to the distributed feedback grating.

25. The semiconductor laser of claim 24 wherein the electrodes are formed on an upper face and a lower face of the semiconductor laser and for the electrode formed on the upper face current flows through the region that contains the distributed feedback gratings.

26. The semiconductor laser of claim 24 wherein the active region layer is formed of InGaAsP confinement layers and at least one InGaAs quantum well layer between the LnGaAsP confinement layers, and the lower and upper cladding layers are formed of n-type InGaP and p-type InGaP, respectively, and the substrate is formed of GaAs.

27. The semiconductor laser of claim 24 wherein the distributed Bragg reflector gratings of each laser device element and the laser device interelement regions have longitudinal ends, and including a light absorbing material formed on the structure at the longitudinal ends of the distributed Bragg reflector gratings and interelement regions to absorb light that passes out from the distributed Bragg reflector gratings and the interelement regions to prevent reflections of light back into the laser device.

28. The semiconductor laser of claim 23 wherein the means for directing current flow to the distributed feedback gratings include an insulating layer on the distributed Bragg reflector gratings to inhibit current flow through these gratings.

29. The semiconductor laser of claim 23 wherein one of the electrodes is formed on a lower face of the substrate and has a window opening formed therein to permit light emission therethrough.

30. The semiconductor laser of claim 23 wherein the interelement regions are formed of highly doped GaAs.

31. The semiconductor laser of claim 23 wherein the interelement regions include a first layer of GaAs of a selected doping type, a second layer of GaAs more heavily doped than the first, layer and of the same selected doping type as the first layer, and a top layer of InGaAs.

32. The semiconductor laser of claim 23 wherein the distributed Bragg reflector gratings longitudinally bounding the distributed feedback grating in each laser device element vary in length as to cause the portions of the laser device containing distributed Bragg reflectors to taper longitudinally as to be narrower in width at outer ends of the laser than at the position where the distributed Bragg reflectors meet the distributed feedback gratings.

33. The semiconductor laser of claim 32 wherein the distributed Bragg reflector gratings of laser device elements and laser device interelement regions have longitudinal ends at the laser outer ends and including a light absorbing material formed on the structure at the longitudinal ends of the distributed Bragg reflector gratings and interelement regions to absorb light that passes out from the distributed Bragg reflector gratings and the interelement regions to prevent reflections of light back into the laser device.

34. The semiconductor laser of claim 32 wherein a light absorbing material formed on the structure has angled edges in the regions where the distributed Bragg reflector gratings do not reach the laser outer ends to prevent reflections of light back into the laser device.

35. The semiconductor laser of claim 1 wherein the laser device elements and the laser device interelement regions are formed in an epitaxial structure on the substrate including a layer with an active region at which light emission occurs, upper and lower cladding layers surrounding the active region layer, each distributed feedback grating in the device elements incorporated with the epitaxial structure having a selected phase shift and comprising periodically alternating grating elements to provide optical feedback as a second order grating for a selected effective wavelength of light generation from the active region, the grating having spacings between adjacent grating element at a selected position intermediate that correspond to the selected phase shift in the grating, the grating formed and positioned to act upon the light generated in the active region to produce a lasing action and an emission, of light from a lower face of the substrate of the semiconductor laser, and wherein the distributed Bragg reflector gratings for each laser device element are incorporated with the epitaxial structure adjacent the distributed feedback grating in each laser device element to reflect light back to the distributed feedback grating.

* * * * *

UNITED STATES PATENT AND TRADEMARK OFFICE
CERTIFICATE OF CORRECTION

| | | |
|---|---|---|
| PATENT NO. | : 7,457,340 B2 | Page 1 of 1 |
| APPLICATION NO. | : 11/112749 | |
| DATED | : November 25, 2008 | |
| INVENTOR(S) | : Dan Botez | |

It is certified that error appears in the above-identified patent and that said Letters Patent is hereby corrected as shown below:

On the cover page,

[*] Notice: Subject to any disclaimer, the term of this patent is extended or adjusted under 35 USC 154(b) by 354 days Delete the phrase "by 354 days" and insert -- by 571 days --

Signed and Sealed this

Twenty-fourth Day of August, 2010

David J. Kappos
*Director of the United States Patent and Trademark Office*